US010727824B2

(12) United States Patent
Kim

(10) Patent No.: US 10,727,824 B2
(45) Date of Patent: Jul. 28, 2020

(54) STROBE GENERATION CIRCUIT AND SEMICONDUCTOR DEVICE INCLUDING THE SAME

(71) Applicant: SK hynix Inc., Gyeonggi-do (KR)

(72) Inventor: Young-Hoon Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/392,128

(22) Filed: Apr. 23, 2019

(65) Prior Publication Data

US 2019/0253041 A1 Aug. 15, 2019

Related U.S. Application Data

(63) Continuation-in-part of application No. 16/056,926, filed on Aug. 7, 2018.

(30) Foreign Application Priority Data

Feb. 1, 2018 (KR) ........................ 10-2018-0012745

(51) Int. Cl.

| | |
|---|---|
| ***H03K 5/13*** | (2014.01) |
| ***H03M 9/00*** | (2006.01) |
| ***H03K 3/037*** | (2006.01) |
| ***G11C 7/22*** | (2006.01) |
| ***G11C 8/18*** | (2006.01) |
| ***G11C 7/10*** | (2006.01) |

(Continued)

(52) U.S. Cl.

CPC ............... *H03K 5/13* (2013.01); *G11C 7/103* (2013.01); *G11C 7/106* (2013.01); *G11C 7/1057* (2013.01); *G11C 7/222* (2013.01); *G11C 8/18* (2013.01); *H03K 3/037* (2013.01); *H03K 3/356139* (2013.01); *H03K 3/356191* (2013.01); *H03K 5/135* (2013.01); *H03K 19/018521* (2013.01); *H03M 9/00* (2013.01); *G11C 2207/107* (2013.01); *H03K 19/20* (2013.01)

(58) Field of Classification Search

None

See application file for complete search history.

(56) References Cited

U.S. PATENT DOCUMENTS

| | | | | |
|---|---|---|---|---|
| 6,278,312 B1 * | 8/2001 | Dabral | .................. | H04L 25/062 327/180 |
| 2006/0044891 A1 * | 3/2006 | Lin | ...................... | G11C 7/1006 365/193 |
| 2015/0229327 A1 | 8/2015 | Nedovic | | |

FOREIGN PATENT DOCUMENTS

| | | |
|---|---|---|
| KR | 10-2015-0052633 | 5/2015 |

* cited by examiner

*Primary Examiner* — Cassandra F Cox

(74) *Attorney, Agent, or Firm* — IP & T Group LLP

(57) ABSTRACT

A strobe generation circuit includes: a main hybrid multiplexing circuit outputting a main pull-up signal and a main pull-down signal to first and second nodes, respectively, the main pull-up and pull-down signals being selectively controlled based on first pull-up and pull-down control signals generated by removing an input loading of main data; a sub hybrid multiplexing circuit outputting a sub pull-up signal and a sub pull-down signal to the first and second nodes, respectively, the sub pull-up and pull-down signals being selectively controlled based on second pull-up and pull-down control signals generated by removing an input loading of sub data; a latch circuit latching a signal of the first node and a signal of the second node to output a first latch signal and a second latch signal; and an output driver outputting a strobe signal according to the first and second latch signals.

16 Claims, 15 Drawing Sheets

(51) Int. Cl.

| | |
|---|---|
| ***H03K 3/356*** | (2006.01) |
| ***H03K 5/135*** | (2006.01) |
| ***H03K 19/0185*** | (2006.01) |
| *H03K 19/20* | (2006.01) |

STROBE GENERATION CIRCUIT AND SEMICONDUCTOR DEVICE INCLUDING THE SAME

CROSS-REFERENCE TO RELATED APPLICATIONS

The present application is a Continuation-In-Part of application, and claims priority under 35 U.S.C. § 120 on, U.S. patent application Ser. No. 16/056,926, filed on Aug. 7, 2018, which claims priority under 35 U.S.C. § 119(a) to Korean Patent Application No. 10-2018-0012745, filed on Feb. 1, 2018, which are incorporated herein by reference in their entirety.

BACKGROUND

1. Field

Various embodiments of the invention relate to a semiconductor designing technology, and more particularly, to a strobe generation circuit including a hybrid-type serializer.

2. Description of the Related Art

Electronic devices include many electronic components. Among them, a semiconductor system may include many electronic components formed of semiconductor devices. The semiconductor devices constituting the semiconductor system may transfer data in synchronization with a clock to perform a serial communication. According to a type of serial communication, asynchronous clock data may be transmitted. When data is transferred via a serial communication in the semiconductor system, a semiconductor device may receive serial data from another semiconductor device and convert received serial data into parallel internal data to speedily handle a large amount of data therein. In addition, the semiconductor device may convert the parallel internal data into serial data that is output to another semiconductor device. In other words, at least one semiconductor device may include a serializer that converts parallel data into serial data to support serial communication through a data bus.

The serializer generally has a structure for sequentially outputting a plurality of data in synchronization with an edge of a clock. Semiconductor systems or semiconductor devices have been developed to operate at high speed with low power consumption. As the operating speed of the semiconductor system or devices increases, the speed of the clock continues to increase. As the power consumption of the semiconductor system or devices becomes lower, the amplitude of the clock and data may decrease. Accordingly, what is needed is a serializer that is capable of accurately converting data even in a high-speed and low-voltage operational environment.

SUMMARY

Embodiments of the invention are directed to a strobe generation circuit including a hybrid-type multiplexing circuit that combines static logic, which is advantageous for a high-speed operation due to small loading of input signals, with dynamic logic, which may maintain a pulse width of an output signal at a uniform level even when the pulse width of the input signals varies, and a semiconductor device including the strobe generation circuit.

In accordance with an embodiment of the present invention, a strobe generation circuit includes: a main hybrid multiplexing circuit suitable for outputting a main pull-up signal and a main pull-down signal to a first node and a second node, respectively, the main pull-up signal and the main pull-down signal being selectively controlled based on a first pull-up control signal and a first pull-down control signal, which are generated by removing an input loading of a plurality of main data inputted to the main hybrid multiplexing circuit; a sub hybrid multiplexing circuit suitable for outputting a sub pull-up signal and a sub pull-down signal to the first node and the second node, respectively, the sub pull-up signal and the sub pull-down signal being selectively controlled based on a second pull-up control signal and a second pull-down control signal, which are generated by removing an input loading of a plurality of sub data inputted to the sub hybrid multiplexing circuit; a latch circuit suitable for latching a signal of the first node and a signal of the second node to output a first latch signal and a second latch signal; and an output driver suitable for outputting a strobe signal according to the first latch signal and the second latch signal.

In accordance with another embodiment of the present invention, a semiconductor device includes: a first strobe generation circuit suitable for latching input data and preliminary data based on a plurality of main clocks and a plurality of sub clocks to output a plurality of first main data and a plurality of first sub data, generating first and second control signals by removing an input loading of the first main data and the first sub data, and generating a first strobe signal according to the first and second control signals; and a second strobe generation circuit suitable for latching inverted input data and inverted preliminary data based on the main clocks and the sub clocks to output a plurality of second main data and a plurality of second sub data, generating third and fourth control signals by removing an input loading of the second main data and the second sub data, and generating a second strobe signal according to the third and fourth control signals, wherein the first strobe generation circuit has substantially the same logic configuration as the second strobe generation circuit.

In accordance with an embodiment of the present invention, a strobe generation circuit includes: a main hybrid multiplexing circuit suitable for receiving a plurality of main data, generating a first pull-up control signal and a first pull-down control signal based on levels of the plurality of main data, and outputting the main pull-up signal and the main pull-down signal to a first node and a second node, respectively, by driving the first node according to the first pull-up control signal and driving the second node according to the first pull-down control signal; a sub hybrid multiplexing circuit suitable for receiving a plurality of sub data, generating a second pull-up control signal and a second pull-down control signal based on levels of the plurality of sub data, and outputting the sub pull-up signal and the sub pull-down signal to the first node and the second node, respectively, by driving the first node according to the second pull-up control signal and driving the second node according to the second pull-down control signal; a latch circuit suitable for latching a signal of the first node and a signal of the second node to output a first latch signal and a second latch signal; a section control circuit suitable for driving the first node and the second node as set levels, based on an entry of a preamble period and an exit from a postamble period; and an output driver suitable for outputting, to an output node, a strobe signal according to the first latch signal and the second latch signal.

These and other features and advantages of the present invention will become apparent to those with ordinary skill in the art to which the present invention belongs from the following description in conjunction with the accompanying drawings.

DETAILED DESCRIPTION

Figure 1A:
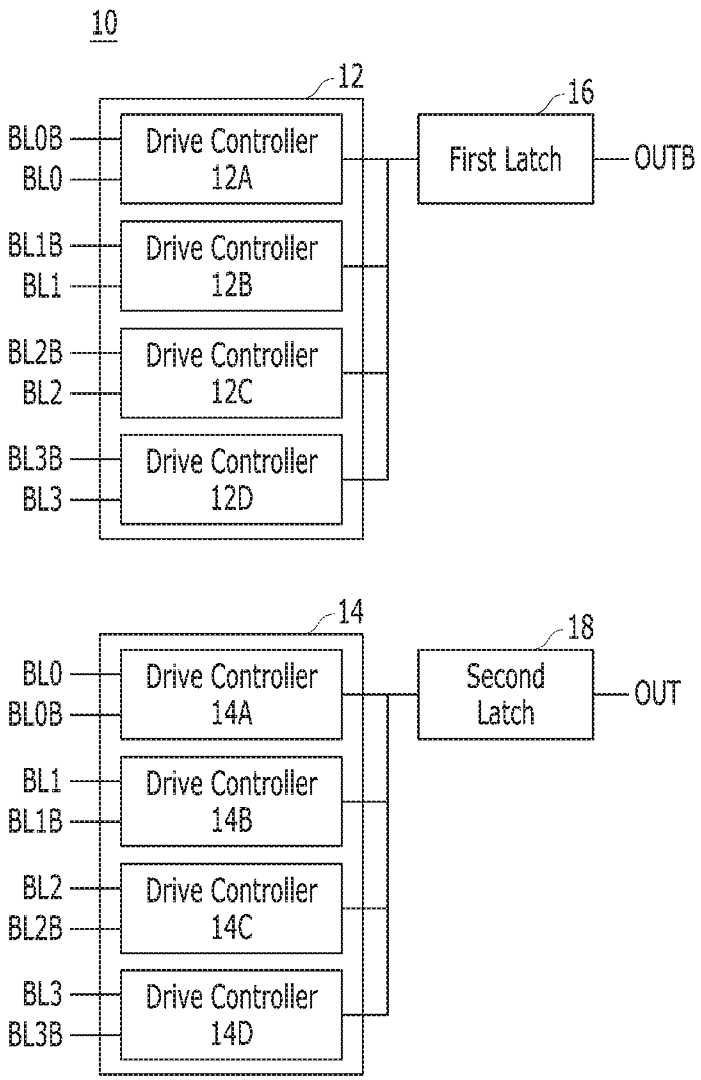
FIG. 1A is a block diagram illustrating a serializer formed of dynamic logic.

Various embodiments of the invention are described below in more detail with reference to the accompanying drawings. The invention may, however, be embodied in different forms and should not be construed as limited to the embodiments set forth herein. Rather, these embodiments are provided so that this disclosure is thorough and complete and fully conveys the scope of the invention to those skilled in the art. Throughout the disclosure, like reference numerals refer to like parts throughout the various figures and embodiments of the invention. Also, throughout the specification, reference to "an embodiment," "another embodiment" or the like is not necessarily to only one embodiment, and different references to any such phrase are not necessarily to the same embodiment(s).

It is to be understood that embodiments of the present invention are not limited to the particulars shown in the drawings, that the drawings are not necessarily to scale, and, in some instances, proportions may have been exaggerated to more clearly depict certain features of the invention. While particular terminology is used, it is to be appreciated that the terminology used is for describing particular embodiments only and is not intended to limit the scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless the context indicates otherwise.

The phrase "at least one of . . . and . . . ," when used herein with a list of items, means a single item from the list or any combination of items in the list. For example, "at least one of A, B, and C" means, only A, or only B, or only C, or any combination of A, B, and C.

The term "or" as used herein means either one of two or more alternatives but not both nor any combinations thereof.

As used herein, the term "and/or" includes any and all combinations of one or more of the associated listed items.

As used herein, singular forms are intended to include the plural forms and vice versa, unless the context clearly indicates otherwise. The articles 'a' and 'an' as used in this application and the appended claims should generally be construed to mean 'one or more' unless specified otherwise or clear from context to be directed to a singular form.

It will be further understood that the terms "includes," and "including" are used interchangeably in this specification with the open-ended terms "comprises," and "comprising," to specify the presence of any stated elements and to not preclude the presence or addition of one or more other non-stated elements.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

Also, as used herein, the term "and/or" includes any and all combinations of one or more of the associated listed items.

It is also noted, that in some instances, as would be apparent to those skilled in the relevant art, a feature or element described in connection with one embodiment may be used singly or in combination with other features or elements of another embodiment, unless otherwise specifically indicated.

A serializer formed of dynamic logic and static logic will be described with reference to FIGS. 1A and 2B. In embodiments of the invention, the static logic may be a circuit that may output an output signal of a defined logic level, e.g., a logic high level or a logic low level, based on the logic level of an input signal, and the dynamic logic may be a circuit capable of outputting an output signal in a high-impedance state (high-Z) based on the logic level of the input signal.

Referring to FIGS. 1A to 2B, by the way of example but not limitation, a 4:1 serializer that receives four differential input data pairs BL0-BL0B, BL1-BL1B, BL2-BL2B, BL3-BL3B and outputs one differential serial data pair OUT-OUTB is described. The differential input data pairs BL0-BL0B, BL1-BL1B, BL2-BL2B, BL3-BL3B may be generated by latching input data (not shown) according to a clock (not shown). The input data BL0 to BL3 and the complementary input data BL0B to BL3B may correspond to a signal in which an input data is differentially amplified and outputted in a sensing section and to data that maintains a logic high level in a pre-charge section.

Figure 1B:
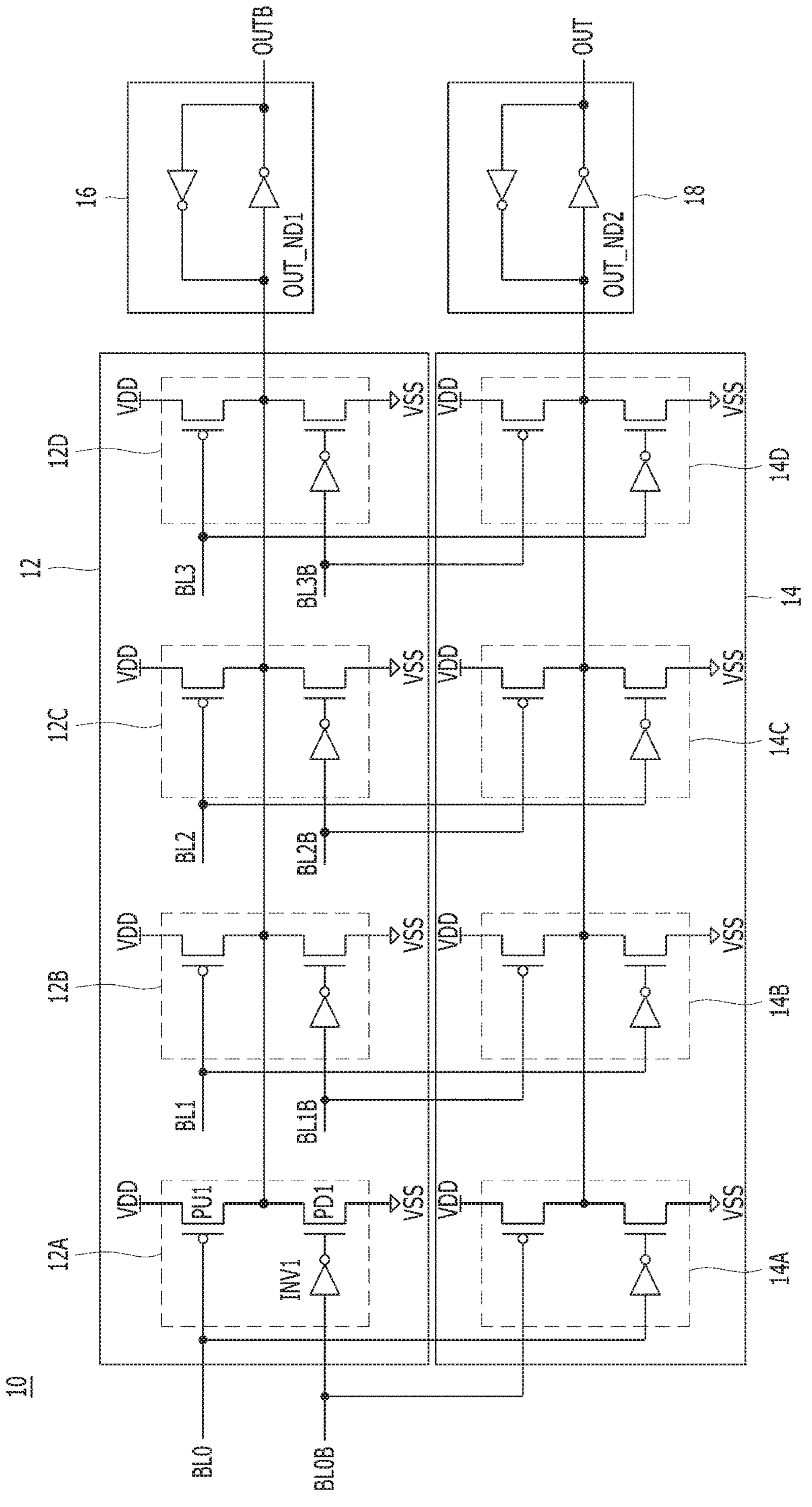
FIG. 1B is a circuit diagram of the serializer shown in FIG. 1A.
Figure 1C:
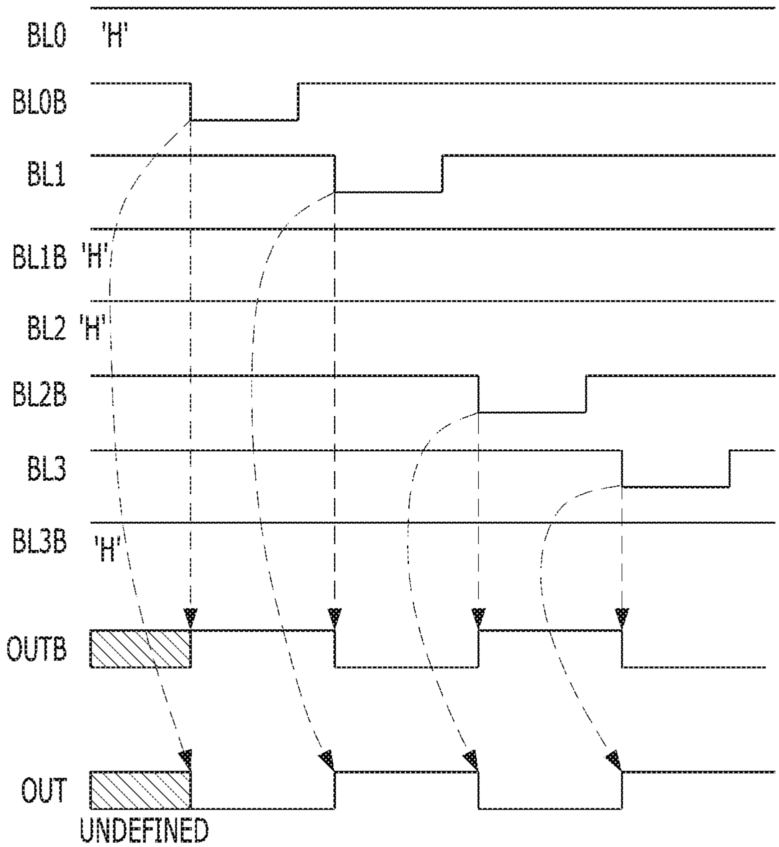
FIG. 1C is an operation waveform diagram of the serializer shown in FIG. 1A.

FIG. 1A is a block diagram illustrating a serializer 10 formed of dynamic logic. FIG. 1B is a circuit diagram of the serializer 10 shown in FIG. 1A. FIG. 1C is an operation waveform diagram of the serializer 10 shown in FIG. 1A.

Referring to FIGS. 1A and 1B, the serializer 10 may include a first dynamic multiplexer (MUX) 12, a second dynamic multiplexer 14, a first latch 16, and a second latch 18.

The first dynamic multiplexer 12 may include a plurality of drive controllers 12A through 12D. Each of the drive controllers 12A to 12D may output a first drive control signal that is enabled or determined based on a corresponding differential input data among the differential input data pairs BL0-BL0B, BL1-BL1B, BL2-BL2B, BL3-BL3B. For example, the first drive controller 12A may include a pull-up transistor PU1, an inverter INV1, and a pull-down transistor PD1. The pull-up transistor PU1 may be coupled between a power source voltage VDD terminal and a first output node OUT_ND1 to receive the input data BL0 through a gate. The pull-down transistor PD1 may be coupled between a ground voltage VSS terminal and the first output node OUT_ND1. The pull-down transistor PD1 may receive an inverted signal of the complementary input data BL0B which is inverted by the inverter INV1 through a gate. The first latch 16 may invert and latch the first drive control signal delivered from the first output node OUT_ND1 to output a serial data OUTB.

The second dynamic multiplexer 14 may include a plurality of drive controllers 14A to 14D. Each of the drive controllers 14A to 14D may output a second drive control signal that is enabled or determined based on the corresponding differential input data among the differential input data pairs BL0-BL0B, BL1-BL1B, BL2-BL2B, BL3-BL3B.

The drive controllers 14A to 14D of the second dynamic multiplexer 14 are substantially the same as the drive controllers 12A to 12D of the first dynamic multiplexer 12. For example, the data inputted to the pull-up transistor and the pull-down transistor of the drive controllers 14A to 14D are reversed compared to data inputted to the pull-up transistor and the pull-down transistor of the drive controllers 12A to 12D. Hence, detailed description of the drive controllers 14B to 14D is omitted here. The second latch 18 may invert and latch the second drive control signal outputted from a second output node OUT_ND2 to output a serial data OUT.

When there are no latches 16 and 18 at the rear end and the input data BL0 to BL3 and the complementary input data BL0B to BL3 are all at a logic high level, the first dynamic multiplexer 12 and the second dynamic multiplexer 14 may output the first drive control signal and the second drive control signal with a high impedance (High-Z) state. However, by having the latches 16, 18 at the rear end, the first dynamic multiplexer 12 and the second dynamic multiplexer 14 can maintain the first drive control signal and the second drive control signal at the previous state, when the input data BL0 to BL3 and the complementary input data BL0B to BL3B are all at a logic high level.

Referring to FIG. 1C, when both the input data BL0 to BL3 and the complementary input data BL0B to BL3B are at a logic high level, the serial data OUTB, OUT may maintain the previous state. In an initial time period where the previous state is not defined, the serial data OUTB and OUT has an undefined state. When any one of the input data BL0 to BL3 is at a logic low level, the serial data OUTB may transition into a logic low level and the serial data OUT may transition into a logic high level. Also, when any one of the complementary input data BL0B to BL3B is at a logic low level, the serial data OUTB may transition to a logic high level and the serial data OUT may transition to a logic low level.

As described above, even though the pulse widths of the differential input data pairs BL0-BL0B, BL1-BL1B, BL2-BL2B, BL3-BL3B change, the serializer 10 including the dynamic logic may determine the pulse width of the serial data pair OUT-OUTB at a uniform level as long as the differential input data pairs BL0-BL0B, BL1-BL1B, BL2-BL2B, BL3-BL3B do not overlap with each other in a time domain. However, the serializer 10 may be limited in a high-speed operation in terms of its performance because of the operational margin or burden for loading the input signals coupled to an input terminal of the first latch 16, i.e., the first output node OUT_ND1, and loading the input signals coupled to an input terminal of the second latch 18, i.e., the second output node OUT_ND2.

Figure 2A:
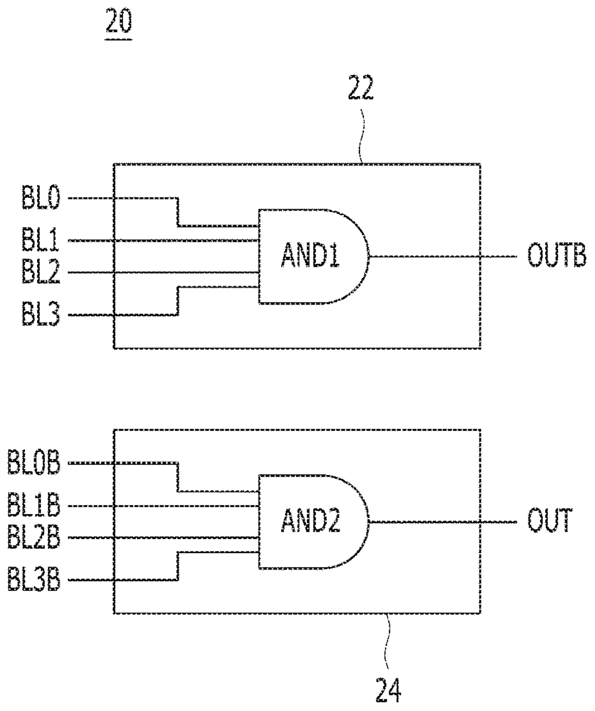
FIG. 2A is a block diagram illustrating a serializer formed of static logic.

FIG. 2A is a block diagram illustrating a serializer 20 formed of static logic. FIG. 2B is an operation waveform diagram of the serializer 20 shown in FIG. 2A.

Referring to FIG. 2A, the serializer 20 may include a first static multiplexer 22 and a second static multiplexer 24. The first static multiplexer 22 may include an AND gate AND1 for receiving input data BL0 to BL3, and may output serial data OUTB. The second static multiplexer 24 may include an AND gate AND2 for receiving complementary input data BL0B to BL3B, and may output serial data OUT.

Figure 2B:
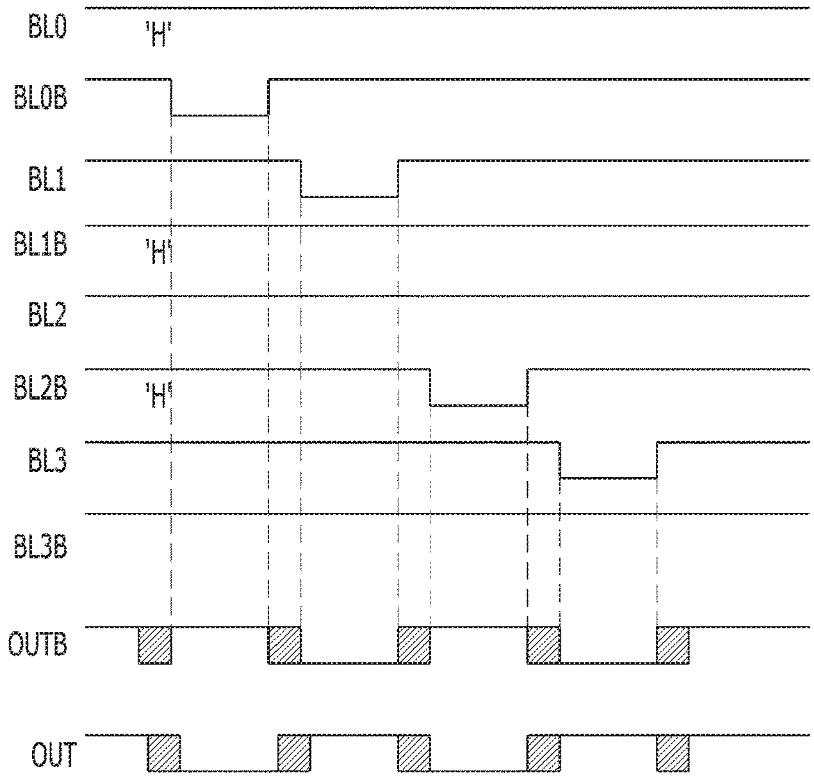
FIG. 2B is an operation waveform diagram of the serializer shown in FIG. 2A.

Referring to FIG. 2B, when the input data BL0 to BL3 and the complementary input data BL0B to BL3B are all at a logic high level, the serial data OUTB and OUT are at a logic high level. When any one of the input data BL0 to BL3 is at a logic low level, the serial data OUTB may transition to a logic low level. Also, when any one of the complementary input data BL0B to BL3B is at a logic low level, the serial data OUT may transition to a logic low level.

As described above, the serializer 20 including the static logic may have an advantage in that it may perform a high-speed operation due to small loading on the input terminal. However, when the pulse widths of the input data BL0 to BL3 and BL0B to BL3B are changed as illustrated in the shaded portion of FIG. 1C, the pulse width of the serial data OUTB and OUT may be changed accordingly. Therefore, in order to operate the serializer 20 including the static logic, it is necessary to precisely adjust the pulse widths of the input data BL0 to BL3 and BL0B to BL3B so that there is no undefined section when the input data transition. However, since the pulse widths of the input data BL0 to BL3 and BL0B to BL3B are changed together due to a change of the duty and the delay amount of the clock due to a change in PVT, it is very difficult to design the serializer 20.

A hybrid-type serializer, in which static logic and dynamic logic are combined, will be described in accordance with an embodiment of the invention.

Figure 3:
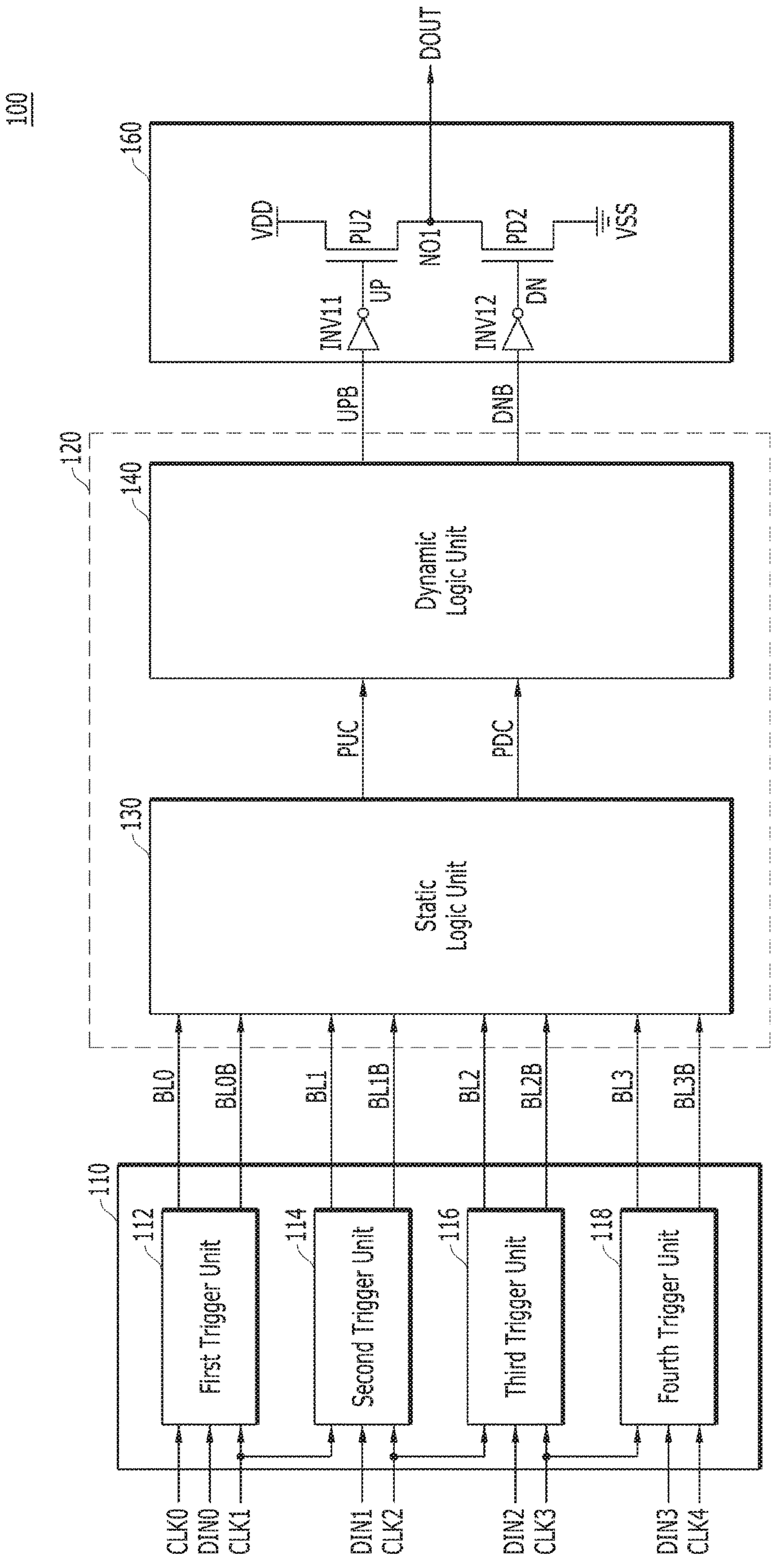
FIG. 3 is a block diagram illustrating a serializer in accordance with an embodiment of the invention.

FIG. 3 is a block diagram illustrating a serializer 100 in accordance with an embodiment of the invention.

Referring to FIG. 3, the serializer 100 may include a data trigger circuit 110, a hybrid multiplexing circuit 120, and an output driver 160. In FIG. 3, by the way of example but not limitation, a 4:1 serializer 100 that receives four input data DIN0 to DIN3 and outputs one serial data DOUT is described.

The data trigger circuit 110 may latch the first to fourth input data DIN0 to DIN3 according to a plurality of clocks CLK0 to CLK4 having a set phase difference to output first to fourth aligned data BL0 to BL3 and first to fourth complementary aligned data BL0B to BL3B. The phase difference may be set by dividing 360 degrees (°) by the number of input data. For example, since the number of the first to fourth input data DIN0 to DIN3 is four, the phase interval may be set according to four clocks having a phase difference of 90 degrees (°), i.e., a quarter of clock cycle. In FIG. 3, the first to fifth clock signals CLK0 to CLK4 are shown, and the fifth clock signal CLK4 may have substantially the same waveform as the first clock signal CLK0 but may be a clock whose phase is delayed by 360 degrees (°).

The data trigger circuit 110 may differentially amplify the first to fourth input data DIN0 to DIN3 according to adjacent clocks among the first to fifth clocks CLK0 to CLK4 to output first to fourth aligned data BL0 to BL3 and first to fourth complementary aligned data BL0B to BL3B, respectively. The data trigger circuit 110 may differentially amplify the first to fourth input data DIN0 to DIN3 in a first section where adjacent clocks among the first to fifth clocks CLK0 to CLK4 have a set logic level, for example, e.g., a logic high level, to output the first to fourth aligned data BL0 to BL3 and the first to fourth complementary aligned data BL0B to BL3B. The data trigger circuit 110 may pre-charge the first to fourth aligned data BL0 to BL3 and the first to fourth complementary aligned data BL0B to BL3B to a logic high level in a second period, that is, a period where at least one of the adjacent clocks has a logic low level.

The data trigger circuit 110 may include first to fourth trigger units 112 to 118 that correspond to the first to fourth input data DIN0 to DIN3, respectively. The first trigger unit 112 may differentially amplify the first input data DIN0 according to the first clock CLK0 and the second clock CLK1 to output first aligned data BL0 and first complementary aligned data BL0B. The second trigger unit 114 may differentially amplify the second input data DIN1 according to the second clock CLK1 and the third clock CLK2 to output the second aligned data BL1 and the second complementary aligned data BL1B. The third trigger unit 116 may differentially amplify the third input data DIN2 according to the third clock CLK2 and the fourth clock CLK3 and output the third aligned data BL2 and the third complementary aligned data BL2B. The fourth trigger unit 118 may differentially amplify the fourth input data DIN3 according to the fourth clock CLK3 and the fifth clock CLK4 and output the fourth aligned data BL3 and the fourth complementary aligned data BL3B.

The hybrid multiplexing circuit 120 may output a pull-down signal DNB and a pull-up signal UPB which are selectively determined or controlled based on a pull-down control signal PDC and a pull-up control signal PUC. The pull-down control signal PDC may be generated by removing or minimizing an input loading of first to fourth aligned data BL0 to BL3. The pull-up control signal PUC may be generated by removing or minimizing an input loading of the first to fourth complementary aligned data BL0B to BL3B. For reference, the "loading" may mean a load determined by signal lines connected to a preset node/terminal, and the "input loading of . . . data" may mean the total amount of loads determined by data lines connected to an input node/terminal when sending the data to an input device. That is, the "input loading of the first to fourth aligned data BL0 to BL3" may mean the total amount of loads determined by data lines of the first to fourth aligned data BL0 to BL3 inputted to the hybrid multiplexing circuit 120. The "input loading of the first to fourth complementary aligned data BL0B to BL3B" may mean the total amount of loads determined by data lines of the first to fourth complementary aligned data BL0B to BL3B inputted to BL3B to the hybrid multiplexing circuit 120.

The hybrid multiplexing circuit 120 may include a static logic unit 130 and a dynamic logic unit 140.

The static logic unit 130 may generate the pull-down control signal PDC by removing the input loading of the first to fourth aligned data BL0 to BL3. The static logic unit 130 may generate the pull-up control signal PUC by removing the input loading of the first to fourth complementary aligned data BL0B to BL3B. In an embodiment of the invention, the static logic unit 130 may output the pull-down control signal PDC at a logic high level when the first to fourth aligned data BL0 to BL3 are all at a logic high level, while outputting the pull-up control signal PUC at a logic high level when the first to fourth complementary aligned data BL0B to BL3B are all at a logic high level. In other words, the static logic unit 130 may output the pull-down control signal PDC at a logic low level when any one among the first to fourth aligned data BL0 to BL3 is at a logic low level. Also, the static logic unit 130 may output the pull-up control signal PUC at a logic low level when any one among the first to fourth complementary aligned data BL0B to BL3B is at a logic low level.

The dynamic logic unit 140 may output the pull-down signal DNB and the pull-up signal UPB which are selectively driven according to the pull-down control signal PDC and the pull-up control signal PUC. The dynamic logic unit 140 may determine that the pull-down signal DNB is a logic high level. The dynamic logic unit 140 may make the pull-up signal UPB be a logic low level when the pull-down control signal PDC is at a logic high level and the pull-up control signal PUC is at a logic low level. Conversely, the dynamic logic unit 140 may control the pull-down signal DNB to have a logic high level and make the pull-up signal UPB be a logic low level when the pull-down control signal PDC is at a logic low level and the pull-up control signal PUC is at a logic high level. The dynamic logic unit 140 may keep the pull-down signal DNB and the pull-up signal UPB in a previous state when both the pull-down control signal PDC and the pull-up control signal PUC have a logic high level.

The output driver 160 may output the serial data DOUT corresponding to the pull-down signal DNB and the pull-up signal UPB. The output driver 160 may include a first inverter INV11, a second inverter INV12, a pull-up transistor PU2, and a pull-down transistor PD2. The first inverter INV11 may invert the pull-up signal UPB, while the second inverter INV12 may invert the pull-down signal DNB. The pull-up transistor PU2 may be coupled in series between a power source voltage VDD terminal and an output terminal NO1. The pull-up transistor PU2 may receive the output signal UP of the first inverter INV11 through a gate. The pull-down transistor PD2 may be coupled in series between a ground voltage VSS terminal and the output terminal NO1.

The pull-down transistor PD2 may receive an output signal DN of the second inverter INV12 through a gate. The pull-up transistor PU2 and the pull-down transistor PD2 may be formed of NMOS transistors. Therefore, the output driver 160 may output the serial data DOUT of a logic high level when the pull-up signal UPB is at a logic low level to output the serial data DOUT of a logic low level when the pull-down signal DNB is at a logic low level.

As described above, the serializer 100 may output one serial data DOUT corresponding to the first to fourth input data DIN0 to DIN3. Herein, the hybrid-type serializer 100 in accordance with an embodiment of the invention may be implemented with a hybrid-type serializer that combines static logic which is advantageous for a high-speed operation due to small loading of input signals and dynamic logic which may maintain a constant pulse width of an output signal even though the pulse width of the input signals varies. The hybrid-type serializer may be able to perform a high-speed operation and improve operational reliability.

A detailed structure of each constituent element of the serializer 100 shown in FIG. 3 will be described below with reference to the accompanying drawings.

Figure 4:
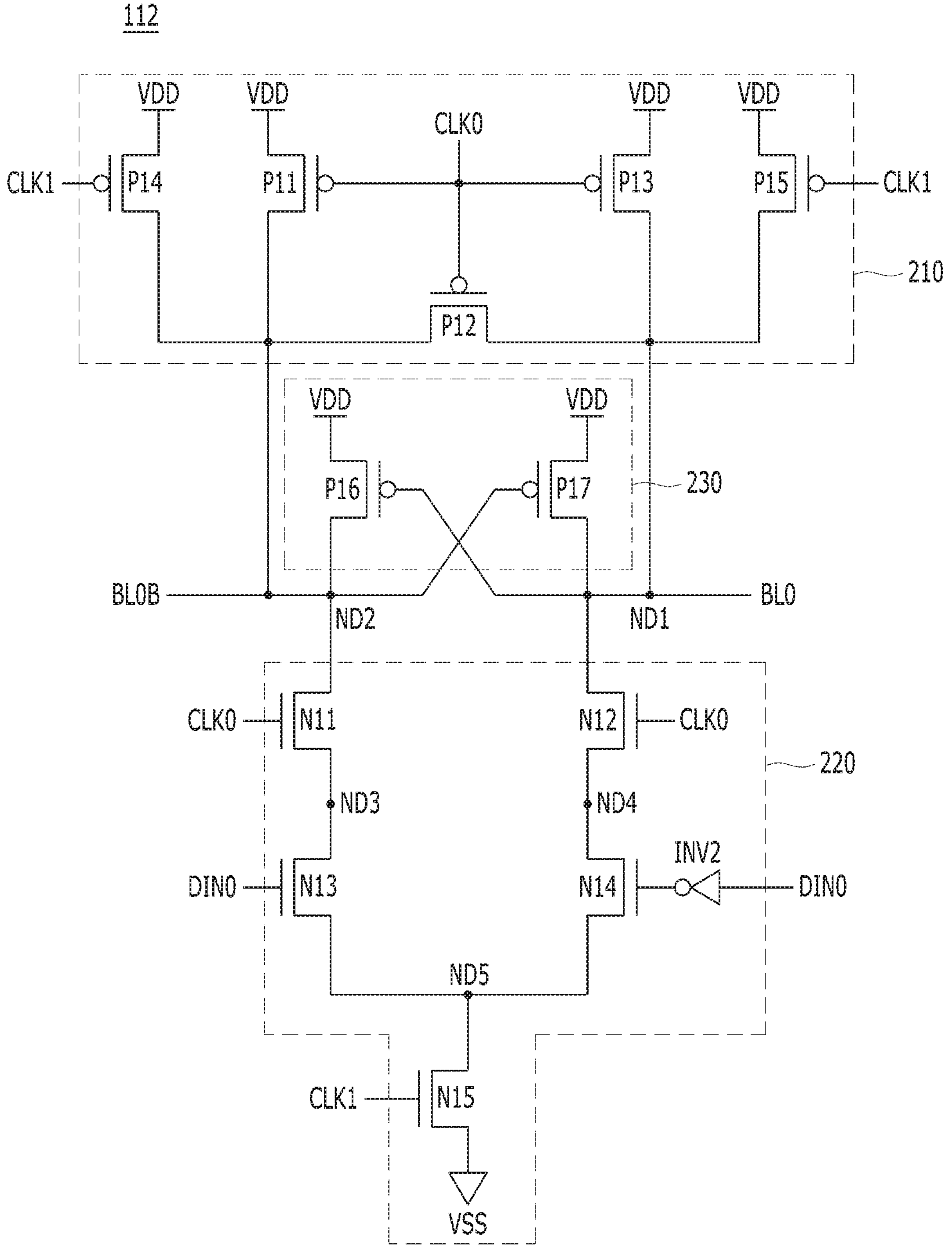
FIG. 4 is a circuit diagram of a first trigger unit illustrated in FIG. 3.

FIG. 4 is a circuit diagram of the first trigger unit 112 illustrated in FIG. 3. Since the first to fourth trigger units 112 to 118 may have substantially the same structure, the first trigger unit 112 will be described as a representative example.

Referring to FIG. 4, the first trigger unit 112 may include an initializer 210, a charge discharger 220, and a charge supplier 230.

The initializer 210 may include first to fifth PMOS transistors P11 to P15. The first to third PMOS transistors P11 to P13 may initialize a first node ND1 that outputs the first aligned data BL0 and a second node ND2 that outputs the first complementary aligned data BL0B to a logic high level in a section where the first clock CLK0 is at a logic low level. The third and fourth PMOS transistors P14 and P15 may initialize the first node ND1 and the second node ND2 to a logic high level in a section where the second clock CLK1 is at a logic low level.

The charge discharger 220 may include first to fifth NMOS transistors N11 to N15. The first NMOS transistor N11 may be coupled between the second node ND2 and the third node ND3 to be turned on in response to the first clock CLK0. The second NMOS transistor N12 may be coupled between the first node ND1 and the fourth node ND4 to be turned on in response to the first clock CLK0. The third NMOS transistor N13 may be coupled between the third node ND3 and the fifth node ND5 to be turned on in response to the first input data DIN0. The fourth NMOS transistor N14 may be coupled between the fourth node ND4 and the fifth node ND5 to be turned on in response to the output of the inverter INV2 which inverts the first input data DIN0 and outputs the inverted first input data. The fifth NMOS transistor N15 may be turned on in response to the second clock CLK1 to discharge the charge of the node ND5. The charge discharger 220 may discharge the charges of the first and second nodes ND1, ND2 based on the logic level of the first input data DIN0 in a section where the first clock CLK0 and the second clock CLK1 are at a logic high level. The charge discharger 220 may set the logic levels of the first and second nodes ND1, ND2. For example, when the first input data DIN0 of a logic high level is inputted, more charges are discharged from the second node ND2 than from the first node ND1, the charge discharger 220 may set the second node ND2 to a logic low level and set the first node ND1 to a logic high level.

The charge supplier 230 may include sixth and seventh PMOS transistors P16 and P17 that are selectively turned on based on the logic levels of the first and second nodes ND1, ND2 to selectively determine or control the first and second nodes ND1, ND2. When the first input data DIN0 of a logic high level is inputted and the second node ND2 is at a logic low level and the first node ND1 is set to a logic high level, the seventh PMOS transistor P17 which is turned on may supply electric charges to the first node ND1 so that the charge supplier 230 may amplify the voltage of the first node ND1. When the first input data DIN0 of a logic low level is inputted and the second node ND2 is at a logic high level and the first node ND1 is set to a logic low level, the sixth PMOS transistor P16 which is turned on may supply electric charges to the second node ND2 so that the charge supplier 230 may amplify the voltage of the second node ND2.

With the above-described structure, the first trigger unit 112 may differentially amplify the first input data DIN0 in a first period where the first clock CLK0 and the second clock CLK1 are at a logic high level to output the first aligned data BL0 and the first complementary aligned data BL0B. The first trigger unit 112 may pre-charge the first aligned data BL0 and the first complementary aligned data BL0B to a logic high level in a second period, which is a period where at least one of the first clock CLK0 and the second clock CLK1 has a logic low level.

Figure 5:
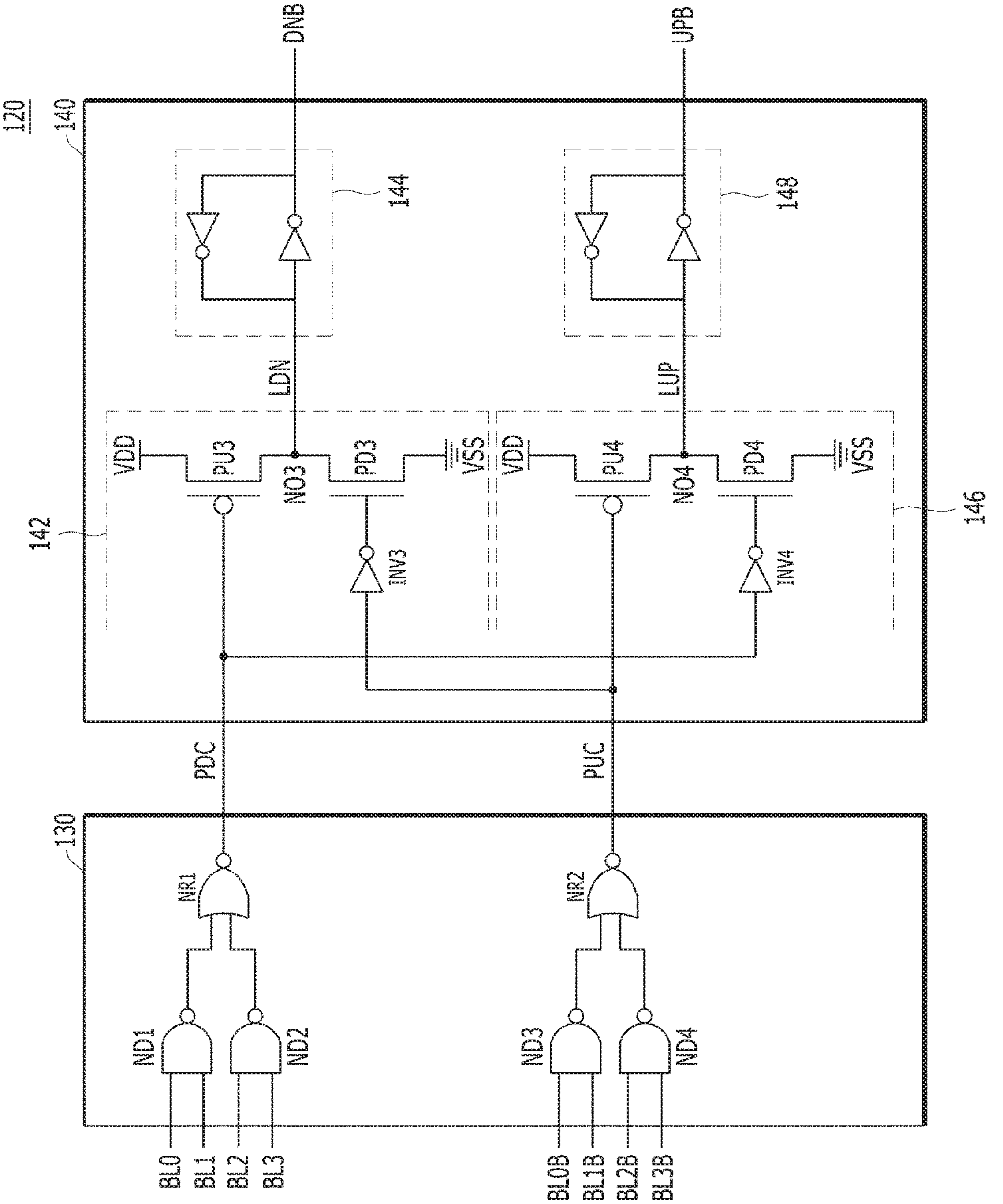
FIG. 5 is a circuit diagram of a static logic unit and a dynamic logic unit illustrated in FIG. 3.

FIG. 5 is a circuit diagram of the static logic unit 130 and a dynamic logic unit 140 illustrated in FIG. 3.

Referring to FIG. 5, the static logic unit 130 may include a plurality of first logic gates ND1, ND2, a second logic gate NR1, a plurality of third logic gates ND3, ND4, and a fourth logic gate NR2.

The first logic gates ND1, ND2 may perform a logic NAND operation onto two adjacent data among the first to fourth aligned data BL0 to BL3. For example, the first logic gate ND1 may perform a logic NAND operation onto the first aligned data BL0 and the second aligned data BL1, and the first logic gate ND2 may perform may perform a logic NAND operation onto the third aligned data BL2 and the fourth aligned data BL3. I an embodiment, each of the first logic gates ND1 and ND2 may be realized with a NAND gate. The second logic gate NR1 may perform a logic NOR operation onto the outputs of the first logic gates ND1, ND2 so as to output the pull-down control signal PDC.

The third logic gates ND3, ND4 may perform a logic NAND operation onto two adjacent data among the first to fourth complementary aligned data BL0B to BL3B. For example, the third logic gate ND3 may perform a logic NAND operation onto the first complementary aligned data BL0B and the second complementary aligned data BL1B, and the third logic gate ND4 may perform a logic NAND operation onto the third complementary aligned data BL2B and the fourth complementary aligned data BL3B. Each of the third logic gates ND3, ND4 may be realized with a NAND gate. The fourth logic gate NR2 may perform a logic NOR operation onto the outputs of the third logic gates ND3, ND4 so as to output the pull-up control signal PUC. Meanwhile, the logic gates of the static logic unit 130 shown in FIG. 5 may be only one example, but the invention is not limited thereto.

The dynamic logic unit 140 may include a first drive controller 142, a first latch 144, a second drive controller 146, and a second latch 148.

The first drive controller 142 may drive the first output signal LDN based on the pull-down control signal PDC and the pull-up control signal PUC. The first drive controller 142 may include a first pull-up transistor PU3, a first inverter INV3, and a first pull-down transistor PD3. The first pull-up transistor PU3 may be coupled between the power source voltage VDD terminal and the first output node NO3 that outputs the first output signal LDN. The first pull-up transistor PU3 as a PMOS transistor may receive the pull-down control signal PDC through a gate. The first pull-down transistor PD3 may be coupled between the ground voltage VSS terminal and the first output node NO3. The first pull-down transistor PD3 as an NMOS transistor may receive an inverted signal of the pull-up control signal PUC inverted in the first inverter INV3 through a gate. The first latch 144 may invert and latch the first output signal LDN outputted from the first output node NO3 to output the pull-down signal DNB.

The second drive controller 146 may drive the second output signal LUP according to the pull-down control signal PDC and the pull-up control signal PUC. The second drive controller 146 may include a second pull-up transistor PU4, a second inverter INV4, and a second pull-down transistor PD4. The second pull-up transistor PU4 may be coupled between the power source voltage VDD terminal and the second output node NO4 that outputs the second output signal LUP. The second pull-up transistor PU4 as a PMOS transistor may receive the pull-up control signal PUC through a gate. The second pull-down transistor PD4 may be coupled between the ground voltage VSS terminal and the second output node NO4. The second pull-down transistor PD4 as an NMOS transistor may receive an inverted signal of the pull-down control signal PDC inverted in the second inverter INV4. The second latch 148 may invert and latch the second output signal LUP outputted from the second output node NO4 and output the pull-up signal UPB.

When the first latch 144 and the second latch 148 do not exist and the pull-down control signal PDC and the pull-up control signal PUC are all at a logic high level, the second drive controller 146 may output the first output signal LDN and the second output signal LUP of a high-impedance state (high-Z).

However, due to the presence of the first latch 144 and the second latch 148 at the rear end, the first drive controller 142 and the second drive controller 146 may maintain the first output signal LDN and the second output signal LUP in a previous state when the pull-down control signal PDC and the pull-up control signal PUC are all at a logic high level.

As described above, the static logic unit 130 may output an output signal of a defined logic level, for example, a logic high level or a logic low level, according to the logic level of the input signal. The static logic unit 130 may be advantageous for a high-speed operation as the loading of input signals are removed. Conversely, the dynamic logic unit 140 may maintain the pulse width of an output signal at a constant level, even though the pulse width of the input signals varies. Therefore, such an embodiment of the invention may improve the operation reliability while capable of performing a high-speed operation through the hybrid-type serializer that combines the static logic and the dynamic logic.

The serializer 10 of FIG. 1B may include eight drive controllers 12A to 12D and 14A to 14D for receiving four differential input data pairs BL0 to BL0B, BL1 to BL1B, BL2 to BL2B, BL3 to BL3B. In the serializer 100 in accordance with an embodiment of the invention, the static logic unit 130 may merge a plurality of aligned data BL0 to BL3, BL0B to BL3B. The dynamic logic unit 140 may be provided with a least or minimum number of drive controllers 142, 146 for receiving the merged data. In other words, the serializer 100 in accordance with an embodiment of the invention may reduce the area and current consumption by sharing the drive controllers 142, 146 for receiving the aligned data BL0 to BL3, BL0B to BL3B.

Figure 6:
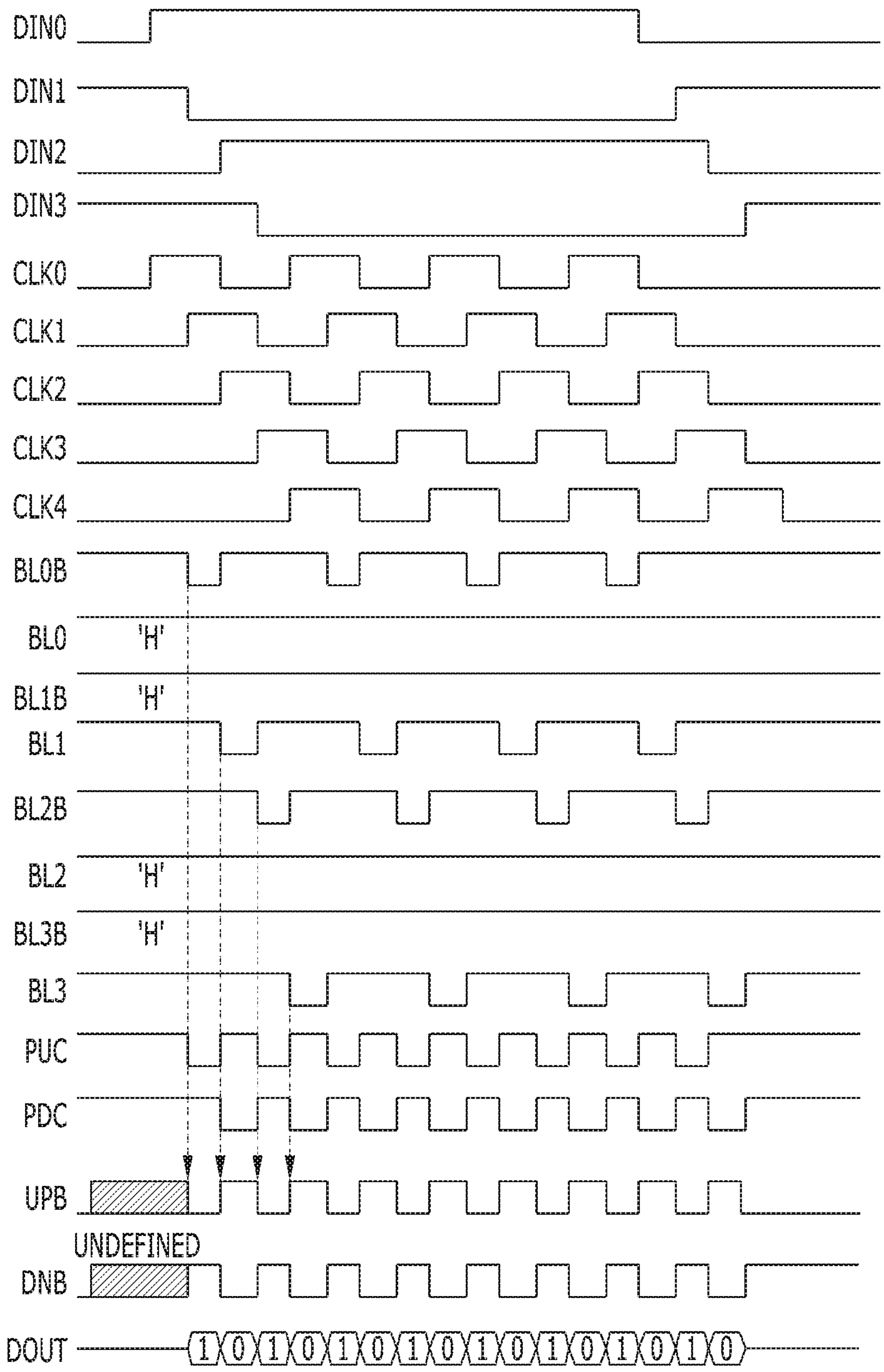
FIG. 6 is an operation waveform diagram of the serializer shown in FIG. 3.

FIG. 6 is an operation waveform diagram of the serializer 100 shown in FIG. 3.

Referring to FIG. 6, the first trigger unit 112 may differentially amplify the first input data DIN0 in a first period where the first clock CLK0 and the second clock CLK1 are at a logic high level to output the first aligned data BL0 and the first complementary aligned data BL0B. The first trigger unit 112 may pre-charge the first aligned data BL0 and the first complementary aligned data BL0B to a logic high level in a second period. Therefore, based on the first input data DIN0 having a logic high level, the first trigger unit 112 may output the first aligned data BL0 that maintains a logic high level and the first complementary aligned data BL0B that toggles to a logic low level in the first period and maintains a logic high level in the second period.

Likewise, based on the second input data DIN1 having a logic low level, the second trigger unit 114 may output the second aligned data BL1 that toggles to a logic low level in the first period and maintains a logic high level in the second period and the second complementary aligned data BL1B that maintains a logic high level. Also, based on the third input data DIN2 having a logic high level, the third trigger unit 116 may output the third aligned data BL2 that maintains a logic high level and the third complementary aligned data BL2B that toggles to a logic low level in the first period and maintains a logic high level in the second period. Based on the fourth input data DIN3 having a logic low level, the fourth trigger unit 118 may output the fourth aligned data BL3 that toggles to a logic low level in the first period and maintains a logic high level in the second period, while outputting the fourth complementary aligned data BL3B that maintains a logic high level.

The static logic unit 130 may output the pull-down control signal PDC at a logic high level when all of the first to fourth aligned data BL0 to BL3 are at a logic high level. The static logic unit 130 may output the pull-up control signal PUC at a logic high level when first to fourth complementary aligned data BL0B to BL3B are at a logic high level. The static logic unit 130 may output the pull-down control signal PDC to a logic low level when any one among the first to fourth aligned data BL0 to BL3 is at a logic low level. The static logic unit 130 may output the pull-up control signal PUC to a logic low level when any one among the first to fourth complementary aligned data BL0B to BL3B is at a logic low level.

The dynamic logic unit 140 may maintain the pull-down signal DNB and the pull-up signal UPB in the previous state when both the pull-down control signal PDC and the pull-up control signal have a logic high level. In the initial period where the previous state is not defined, the pull-down signal DNB and the pull-up signal UPB may have an undefined state. The dynamic logic unit 140 may drive the pull-down signal DNB to a logic high level and drive the pull-up signal UPB to a logic low level when the pull-down control signal PDC is at a logic high level and the pull-up control signal PUC is at a logic low level. The dynamic logic unit 140 may drive the pull-down signal DNB to a logic high level and drive the pull-up signal UPB to a logic low level when the pull-down control signal PDC is at a logic low level and the pull-up control signal PUC is at a logic high level.

The output driver 160 may output serial data DOUT of a logic high level when the pull-up signal UPB is at a logic low level. The output driver 160 may output serial data DOUT of a logic low level when the pull-down signal DNB is at a logic low level.

Figure 7:
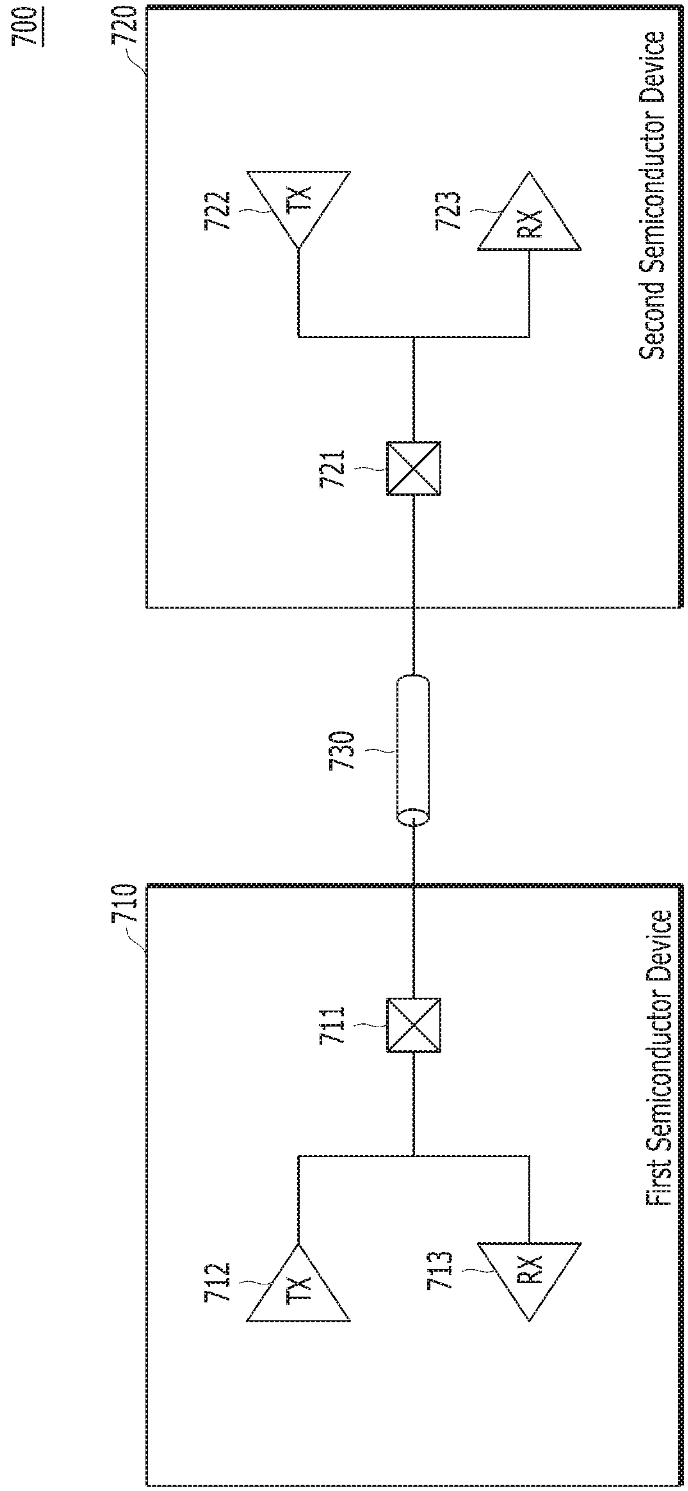
FIG. 7 is a block diagram illustrating a structure of a semiconductor system in accordance with another embodiment of the invention.

FIG. 7 is a block diagram illustrating a structure of a semiconductor system 700 in accordance with an embodiment of the invention.

Referring to FIG. 7, the semiconductor system 700 may include a first semiconductor device 710 and a second semiconductor device 720. The first semiconductor device 710 and the second semiconductor device 720 may be electronic components that communicate with each other. In accordance with an embodiment of the invention, the first semiconductor device 710 may be a master device and the second semiconductor device 720 may be a slave device which is controlled by the first semiconductor device 710. For example, the first semiconductor device 710 may be a host device such as a processor, and the processor may be a central processing unit (CPU), a graphic processing unit (GPU), a multi-media processor (MMP), and a digital signal processor (DSP). Also, it may be realized in the form of a System On Chip (SoC) by combining processor chips having diverse functions, such as an application processor (AP). The second semiconductor device 720 may be a memory, which may include a volatile memory and/or a non-volatile memory. For example, the volatile memory may include a static random access memory (SRAM), a dynamic random access memory (DRAM), a synchronous DRAM (SDRAM) and the like. For example, the non-volatile memory may include a read only memory (ROM), a programmable read only memory (PROM), an electrically erasable and programmable ROM (EEPROM), a flash memory, a phase change RAM (PRAM), a magnetic RAM (MRAM), a resistive RAM (RRAM), a ferroelectric RAM (FRAM), and the like.

The first and second semiconductor devices 710, 720 may be coupled to each other through a signal transfer line 730. The first semiconductor device 710 may include a pad 711 and the pad 711 may be coupled to the signal transfer line 730. The second semiconductor device 720 may include a pad 721 and the pad 721 may be coupled to the signal transfer line 730. The signal transfer line 730 may be a channel, a link, or a bus.

The first semiconductor device 710 may include a transfer circuit TX 712 and a receiving circuit RX 713. The transfer circuit 712 may generate an output signal based on an internal signal of the first semiconductor device 710 and may transfer the output signal to the second semiconductor device 720 through the signal transfer line 730. The receiving circuit 713 may receive the signal transferred from the second semiconductor device 720 through the signal transfer line 730 to generate the internal signal.

Similarly, the second semiconductor device 720 may include a transfer circuit TX 722 and a receiving circuit RX 723. The transfer circuit 722 may generate an output signal based on an internal signal of the second semiconductor device 720 and may transfer the output signal to the first semiconductor device 710 through the signal transfer line 730. The receiving circuit 723 may receive the signal transferred from the first semiconductor device 710 through the signal transfer line 730 to generate the internal signal.

The signal transfer line 730 may be a data bus, and the signal transferred through the signal transfer line 730 may be data. The transfer circuit 712 of the first semiconductor device 710 may transfer the internal data of the first semiconductor device 710 to the second semiconductor device 720. The receiving circuit 713 may receive the data from the second semiconductor device 720. The transfer circuit 722 of the second semiconductor device 720 may transfer the internal data of the second semiconductor device 720 to the first semiconductor device 710. The receiving circuit 723 may receive the data from the first semiconductor device 710. The first and second semiconductor devices 710, 720 may perform a serial communication. Serial data may be transmitted via the signal transfer line 730. The first and second semiconductor devices 710, 720 may convert the serial data into parallel internal data in order to quickly process the large capacity data. The receiving circuits 713, 723 may include a parallelizer (not shown) for receiving serial data and converting the serial data into parallel data. The transfer circuits 712, 722 may include a serializer (not shown) for converting the parallel internal data into serial data. The serializer 100 in accordance with an embodiment of the present invention shown in FIG. 3 may be applied as a serializer of the transfer circuits 712, 722.

A case where a hybrid-type serializer is embedded into a semiconductor device, i.e., a device for generating and outputting a data strobe signal DQS and a data strobe bar signal DQSB, will be described in accordance with an embodiment of the invention.

Figure 8A:
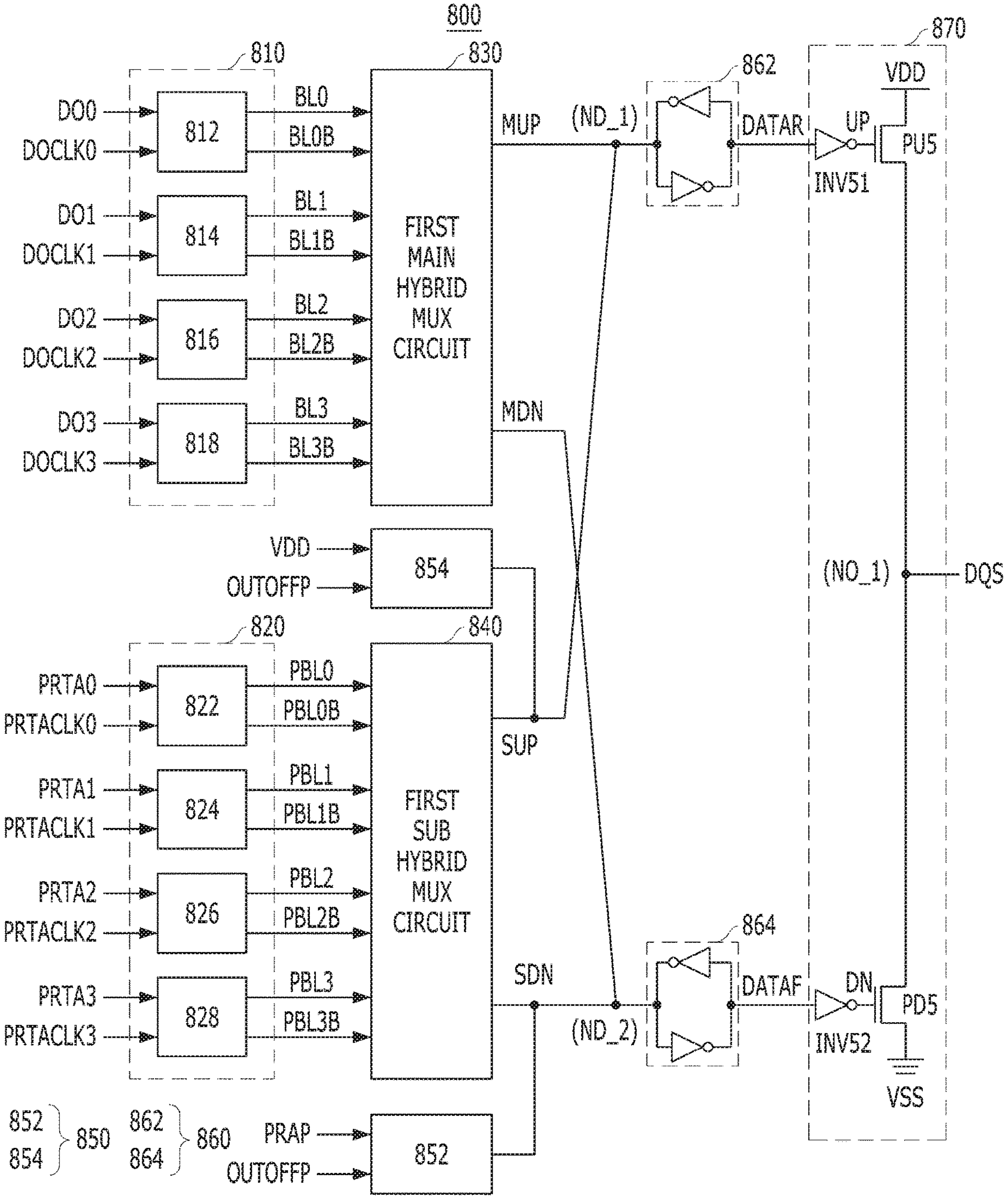
FIGS. 8A and 8B are block diagrams illustrating a structure of a semiconductor device in accordance with an embodiment of the invention.
Figure 8B:
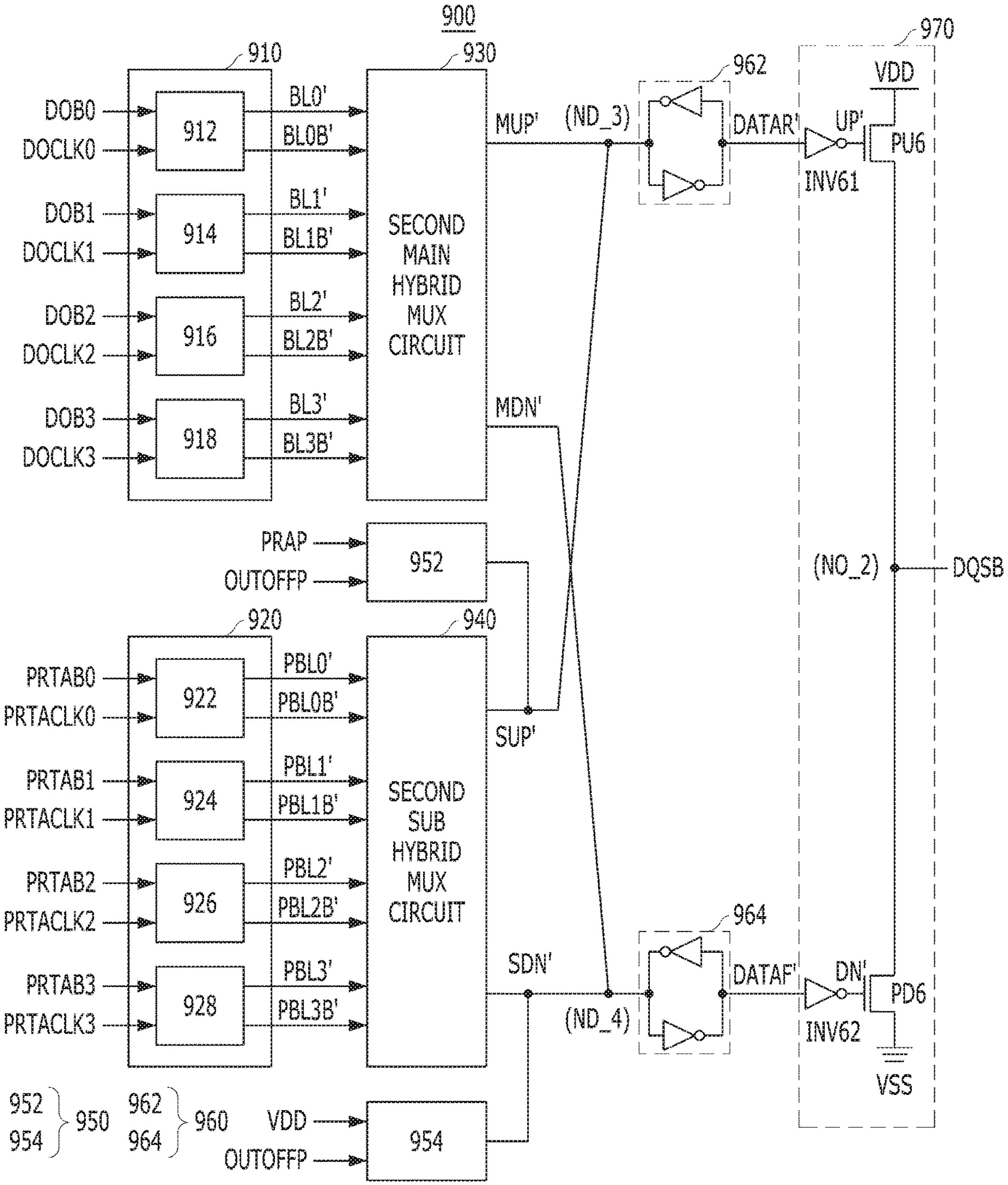

FIGS. 8A and 8B are block diagrams illustrating a structure of a semiconductor device in accordance with an embodiment of the invention. FIG. 8A shows a case where the hybrid-type serializer is embedded into a first strobe generation circuit 800 for generating and outputting the data strobe signal DQS. FIG. 8B shows a case where the hybrid-type serializer is embedded into a second strobe generation circuit 900 for generating and outputting the data strobe bar signal DQSB.

Referring to FIG. 8A, the first strobe generation circuit 800 may include a first main trigger circuit 810, a first sub trigger circuit 820, a first main hybrid multiplexing (mux) circuit 830, a first sub hybrid multiplexing (mux) circuit 840, a first latch circuit 860 and a first output driver 870.

The first main trigger circuit 810 may latch input data DO0 to DO3 according to a plurality of main clocks DOCLK0 to DOCLK3, and output a plurality of main data BL0 to BL3 and BL0B to BL3B. The plurality of main data BL0 to BL3 and BL0B to BL3B may be differential data including first to fourth main data BL0 to BL3 and first to fourth complementary main data BL0B to BL3B. The first main trigger circuit 810 differentially amplify first to fourth input data DO0 to DO3 during an activation section of first to fourth main clocks DOCLK0 to DOCLK3 to output the first to fourth main data BL0 to BL3 and the first to fourth complementary main data BL0B to BL3B, respectively.

The first main trigger circuit 810 may include first to fourth trigger units 812 to 818 each of which receives the first to fourth input data DO0 to DO3 and the first to fourth main clocks DOCLK0 to DOCLK3, respectively. The first trigger unit 812 may differentially amplify the first input data DO0 according to the first main clock DOCLK0 to output the first main data BL0 and the first complementary main data BL0B. The second trigger unit 814 may differentially amplify the second input data DO1 according to the second main clock DOCLK1 to output the second main data BL1 and the second complementary main data BL1B. The third trigger unit 816 may differentially amplify the third input data DO2 according to the third main clock DOCLK2 to output the third main data BL2 and the third complementary main data BL2B. The fourth trigger unit 818 may differentially amplify the fourth input data DO3 according to the fourth main clock DOCLK3 to output the fourth main data BL3 and the fourth complementary main data BL3B.

The first sub trigger circuit 820 may latch preliminary data PRTA0 to PRTA3 according to a plurality of sub clocks PRTACLK0 to PRTACLK3, and output a plurality of sub data PBL0 to PBL3 and PBL0B to PBL3B. The plurality of sub data PBL0 to PBL3 and PBL0B to PBL3B may be differential data including first to fourth sub data PBL0 to PBL3 and first to fourth complementary sub data PBL0B to PBL3B. The first sub trigger circuit 820 may differentially amplify first to fourth preliminary data PRTA0 to PRTA3 during an activation section of first to fourth sub clocks PRTACLK0 to PRTACLK3 to output the first to fourth sub data PBL0 to PBL3 and the first to fourth complementary sub data PBL0B to PBL3B, respectively. The first sub trigger circuit 820 may include fifth to eighth trigger units 822 to 828 each of which receives the first to fourth preliminary data PRTA0 to PRTA3 and the first to fourth sub clocks PRTACLK0 to PRTACLK3, respectively. The fifth to eighth trigger units 822 to 828 of the first sub trigger circuit 820 may have substantially the same structures as the first to fourth trigger units 812 to 818 of the first main trigger circuit 810.

The first to fourth main clocks DOCLK0 to DOCLK3 may toggle with a set phase difference. The phase difference may be set by dividing 360 degrees (°) by the number of input data. For example, since the number of the first to fourth input data DO0 to DO3 is four, the phase interval may be set according to four clocks having a phase difference of 90 degrees (°), i.e., a quarter of clock cycle.

In general, the data strobe signal DQS maintains a high impedance (High-Z) state except for a duration in which data are inputted and outputted (data input/output (I/O) period). The data strobe signal DQS may toggle during a preamble period corresponding to at least one clock cycle before the data I/O period, the data I/O period in which the data are inputted and outputted, and a postamble period corresponding to at least one clock cycle after the data I/O period. The first sub trigger circuit 820 and the first sub hybrid mux circuit 840 of FIG. 8A may be provided to generate a toggling pattern during the preamble period and the postamble period of the data strobe signal DQS. The first to fourth main clocks DOCLK0 to DOCLK3 toggle during the data I/O period, and the first to fourth sub clocks PRTACLK0 to PRTACLK3 toggle during the preamble period and the postamble period. In embodiment, the first to fourth sub clocks PRTACLK0 to PRTACLK3 may include a first group which toggles with a set phase (e.g., 90 degrees (°)) during the preamble period, and a second group which toggles with the set phase during the postamble period. For example, the first group may include the first and second sub clocks PRTACLK0 and PRTACLK1, and the second group may include the third and fourth sub clocks PRTACLK2 and PRTACLK3.

The first main hybrid mux circuit 830 may generate a first pull-up control signal (PUC1, not shown) and a first pull-down control signal (PDC1, not shown) by removing or minimizing an input loading of the first to fourth main data BL0 to BL3 and the first to fourth complementary main data BL0B to BL3B. The first main hybrid mux circuit 830 may output a main pull-up signal MUP and a main pull-down signal MDN, which are selectively determined or controlled based on the first pull-up control signal PUC1 and the first pull-down control signal PDC1, to a first node ND_1 and a second node ND_2, respectively. For reference, the "loading" may mean a load determined by signal lines connected to a preset node/terminal, and the "input loading of . . . data" may mean the total amount of loads determined by data lines connected to an input node/terminal when sending the data to an input device. That is, the "input loading of the first to fourth main data BL0 to BL3" may mean the total amount of loads determined by data lines of the first to fourth main data BL0 to BL3 inputted to the first main hybrid mux circuit 830. The "input loading of the first to fourth complementary main data BL0B to BL3B" may mean the total amount of loads determined by data lines of the first to fourth complementary main data BL0B to BL3B inputted to the first main hybrid mux circuit 830.

The first sub hybrid mux circuit 840 may generate a second pull-up control signal (PUC2, not shown) and a second pull-down control signal (PDC2, not shown) by removing or minimizing an input loading of the first to fourth sub data PBL0 to PBL3 and the first to fourth complementary sub data PBL0B to PBL3B. The first sub hybrid mux circuit 840 may output a sub pull-up signal SUP and a sub pull-down signal SDN, which are selectively determined or controlled based on the second pull-up control signal PUC2 and the second pull-down control signal PDC2, to the first node ND_1 and the second node ND_2, respectively. Likewise, the "input loading of the first to fourth sub data PBL0 to PBL3" may mean the total amount of loads determined by data lines of the first to fourth sub data PBL0 to PBL3 inputted to the first sub hybrid mux circuit 840. The "input loading of the first to fourth complementary sub data PBL0B to PBL3B" may mean the total amount of loads determined by data lines of the first to fourth complementary sub data PBL0B to PBL3B inputted to PBL3B to the first sub hybrid mux circuit 840.

As a result, the main pull-up signal MUP and the sub pull-up signal SUP are merged at the first node ND_1, and the main pull-down signal MDN and the sub pull-down signal SDN are merged at the second node ND_2.

The first latch circuit 860 may include a first latch 862 and a second latch 864. Preferably, each of the first latch 862 and the second latch 864 may be composed of a pair of cross-coupled inverters whose input/output are coupled to each other. The first latch 862 may invert and latch a signal at the first node ND_1 and output a first latch signal DATAR. The second latch 864 may invert and latch a signal at the second node ND_2 and output a second latch signal DATAF.

For reference, the first latch 862 and the second latch 864 of FIG. 8A may correspond to the first latch 144 and the second latch 148 of the dynamic logic unit 140 in FIG. 5, respectively. In this embodiment, the first main hybrid mux circuit 830 and the first sub hybrid mux circuit 840 do not include any latch. Instead, it is indicated that the first latch 862 and the second latch 864 are provided in a separate configuration. However, embodiments of the present invention are not limited thereto. Meanwhile, the first latch 862 and the second latch 864 may be included in the first main hybrid mux circuit 830 and the first sub hybrid mux circuit 840, or additional latches may be provided in the first main hybrid mux circuit 830 and the first sub hybrid mux circuit 840.

The first output driver 870 may output the data strobe signal DQS according to the first latch signal DATAR and the second latch signal DATAF. The first output driver 870 may include a first inverter INV51, a second inverter INV52, a first pull-up transistor PU5, and a first pull-down transistor PD5. The first inverter INV51 may invert the first latch signal DATAR, while the second inverter INV52 may invert the second latch signal DATAF. The first pull-up transistor PU5 may be coupled in series between a power source voltage (VDD) terminal and a first output terminal NO_1, and receive an output signal UP of the first inverter INV51 through a gate. The first pull-down transistor PD5 may be coupled in series between a ground voltage (VSS) terminal and the first output terminal NO_1, and receive an output signal DN of the second inverter INV52 through a gate. The first pull-up transistor PU5 and the first pull-down transistor PD5 may be formed of NMOS transistors. Therefore, the first output driver 870 may output the data strobe signal DQS of a logic high level by driving the first output terminal NO_1 with a power source voltage VDD when the first latch signal DATAR is at a logic low level. The first output driver 870 may output the data strobe signal DQS of a logic low level by driving the first output terminal NO_1 with a ground voltage VSS when the second latch signal DATAF is at a logic low level.

The first strobe generation circuit 800 may further include a first section control circuit 850. The first section control circuit 850 may control an entry to the preamble period of the data strobe signal DQS according to a first section control signal PRAP, and control an exit from the postamble period of the data strobe signal DQS according to a second section control signal OUTOFFP. The first section control signal PRAP may be a pulse signal which is set to a logic low level for a set time at the entry to the preamble period, i.e., before the first and second sub clocks PRTACLK0 and PRTACLK1 of the first group toggle. The second section control signal OUTOFFP may be a pulse signal which is set to a logic low level for a set time at the exit from the postamble period, i.e., after the third and fourth sub clocks PRTACLK2 and PRTACLK3 of the second group toggle.

In detail, the first section control circuit 850 may include a first section controller 852 and a second section controller 854. The first section controller 852 may drive the second node ND_2 to a logic high level according to the first section control signal PRAP, and drive the second node ND_2 to a logic low level according to the second section control signal OUTOFFP. The second section controller 854 may drive the first node ND_1 to a logic low level according to the second section control signal OUTOFFP.

Referring to FIG. 8B, the second strobe generation circuit 900 may include a second main trigger circuit 910, a second sub trigger circuit 920, a second main hybrid multiplexing (mux) circuit 930, a second sub hybrid multiplexing (mux) circuit 940, a second latch circuit 960 and a second output driver 970.

The second main trigger circuit 910 may latch inverted input data DOB0 to DOB3 according to the plurality of main clocks DOCLK0 to DOCLK3, and output a plurality of main data BL0' to BL3' and BL0B' to BL3B'. The second main trigger circuit 910 may ninth to twelfth trigger units 912 to 918 each of which receives first to fourth inverted input data DOB0 to DOB3 and the first to fourth main clocks DOCLK0 to DOCLK3, respectively. The ninth to twelfth trigger units 912 to 918 of the second main trigger circuit 910 may have substantially the same structures as the first to fourth trigger units 812 to 818 of the first main trigger circuit 810.

The second sub trigger circuit 920 may latch inverted preliminary data PRTAB0 to PRTAB3 according to the plurality of sub docks PRTACLK0 to PRTACLK3, and output a plurality of sub data PBL0' to PBL3' and PBL0B' to PBL3B'. The second sub trigger circuit 920 may thirteenth to sixteenth trigger units 922 to 928 each of which receives first to fourth inverted preliminary data PRTAB0 to PRTAB3 and the first to fourth sub docks PRTACLK0 to PRTACLK3, respectively. The thirteenth to sixteenth units 922 to 928 of the second sub trigger circuit 920 may have substantially the same structures as the fifth to eighth trigger units 822 to 828 of the first sub trigger circuit 820.

The second main hybrid mux circuit 930 may generate a third pull-up control signal (PUC3, not shown) and a third pull-down control signal (PDC3, not shown) by removing or minimizing an input loading of first to fourth main data BL0' to BL3' and first to fourth complementary main data BL0B' to BL3B'. The second main hybrid mux circuit 930 may output a main pull-up signal MUP' and a main pull-down signal MDN', which are selectively determined or controlled based on the third pull-up control signal PUC3 and the third pull-down control signal PDC3, to a third node ND_3 and a fourth node ND_4, respectively. The "input loading of the first to fourth main data BL0' to BL3'" may mean the total amount of loads determined by data lines of the first to fourth main data BL0' to BL3' inputted to the second main hybrid mux circuit 930. The "input loading of the first to fourth complementary main data BL0B' to BL3B'" may mean the total amount of loads determined by data lines of the first to fourth complementary main data BL0B' to BL3B' inputted to the second main hybrid mux circuit 930.

The second sub hybrid mux circuit 940 may generate a fourth pull-up control signal (PUC4, not shown) and a fourth pull-down control signal (PDC4, not shown) by removing or minimizing an input loading of first to fourth sub data PBL0' to PBL3' and first to fourth complementary sub data PBL0B' to PBL0B'. The second sub hybrid mux circuit 940 may output a sub pull-up signal SUP' and a sub pull-down signal SDN', which are selectively determined or controlled based on the fourth pull-up control signal PUC4 and the fourth pull-down control signal PDC4, to the third node ND_3 and the fourth node ND_4, respectively. Likewise, the "input loading of the first to fourth sub data PBL0' to PBL3'" may mean the total amount of loads determined by data lines of the first to fourth sub data PBL0' to PBL3' inputted to the second sub hybrid mux circuit 940. The "input loading of the first to fourth sub data PBL0B' to PBL3B'" may mean the total amount of loads determined by data lines of the first to fourth complementary sub data PBL0B' to PBL3B' inputted to the second sub hybrid mux circuit 940.

The second main hybrid mux circuit 930 and the second sub hybrid mux circuit 940 may have substantially the same structures as the first main hybrid mux circuit 830 and the first sub hybrid mux circuit 840. As a result, the main pull-up signal MUP' and the sub pull-up signal SUP' are merged at the third node ND_3, and the main pull-down signal MDN' and the sub pull-down signal SDN' are merged at the fourth node ND_4.

The second latch circuit 960 may include a third latch 962 and a fourth latch 964. The third latch 962 and the fourth latch 964 may have substantially the same structures as the first latch 862 and the second latch 864.

The second output driver 970 may output the data strobe bar signal DQSB according to a third latch signal DATAR' outputted from the third latch 962 and the fourth latch signal DATAF' outputted from the fourth latch 964. The second output driver 970 may include a third inverter INV61, a fourth inverter INV62, a second pull-up transistor PU6, and a second pull-down transistor PD6. The second output driver 970 may have substantially the same structure as the first output driver 870.

Meanwhile, the second strobe generation circuit 900 may further include a second section control circuit 950. The second section control circuit 950 may control an entry to the preamble period of the data strobe bar signal DQSB according to the first section control signal PRAP, and control an exit from the postamble period of the data strobe bar signal DQSB according to the second section control signal OUTOFFP.

In detail, the second section control circuit 950 may include a third section control unit 952 and a fourth section control unit 954. The third section control unit 952 may drive the third node ND_3 to a logic high level according to the first section control signal PRAP, and drive the third node ND_3 to a logic low level according to the second section control signal OUTOFFP. The fourth section control unit 954 may drive the fourth node ND_4 to a logic low level according to the second section control signal OUTOFFP.

As shown in FIGS. 8A and 8B, the first strobe generation circuit 800 may latch input data (i.e., DO0 to DO3) and preliminary data (i.e., PRTA0 to PRTA3) based on a plurality of main clocks (i.e., DOCLK0 to DOCLK3) and sub clocks (i.e., PRTACLK0 to PRTACLK3) to output a plurality of first main data (i.e., BL0 to BL3 and BL0B to BL3B) and first sub data (i.e., PBL0 to PBL3 and PBL0B to PBL3B). The first strobe generation circuit 800 may generate first and second control signals (i.e., PUC1/PDC1 and PUC2/PDC2) by removing an input loading of the first main data and the first sub data, and generate a first strobe signal (DQS) according to the first and second control signals. Further, the second strobe generation circuit 900 may latch inverted input data (i.e., DOB0 to DOB3) and inverted preliminary data (i.e., PRTAB0 to PRTAB3) based on the main clocks and the sub clocks to output a plurality of second main data (i.e., BL0' to BL3' and BL0B' to BL3B') and second sub data (i.e., PBL0' to PBL3' and PBL0B' to PBL3B'). The second strobe generation circuit 900 may generate third and fourth control signals (i.e., PUC3/PDC3 and PUC4/PDC4) by removing an input loading of the second main data and the second sub data, and generate a second strobe signal (DQSB) according to the third and fourth control signals. In the present invention, the first strobe generation circuit 800 may have the substantially the same logic configuration as the second strobe generation circuit 900.

Ideally, the data strobe bar signal DQSB outputted from the second strobe generation circuit 900 of FIG. 8B should have an opposite phase difference, i.e., 180 degrees (°), to the data strobe signal DQS outputted from the first strobe generation circuit 800 of FIG. 8A. However, in case where the conventional main mux circuit and sub mux circuit are composed of dynamic multiplexers as shown in FIGS. 1A and 1B, an input loading thereof becomes relatively larger. Thus, it is required to embed additional logic gates and/or circuits for performing a logic operation on an output of the main mux circuit and an output of the sub mux circuit, so as to merge two outputs at one node. At this time, the logic gates and/or circuits used in a circuit for generating the data strobe signal DQS has a configuration different from the logic gates and/or circuits used in a circuit for generating the data strobe bar signal DQSB. Accordingly, a duty ratio between the data strobe signal DQS and the data strobe bar signal DQSB may be distorted according to a process, voltage and temperature (PVT) variation. As a result, since the data strobe signal DQS and the data strobe bar signal DQSB do not have the opposite phase difference, i.e., 180 degrees (°), a valid window of a final strobe signal varies according to the PVT variation.

In accordance with embodiments of the present invention, by implementing the main mux circuit and the sub mux circuit to have hybrid mux circuits, it is possible to remove or minimize the input loading thereof. Accordingly, the first strobe generation circuit 800 and the second strobe generation circuit 900 may be configurable without embedding additional logic gates/circuits. For example, in the first strobe generation circuit 800, the main pull-up signal MUP and the sub pull-up signal SUP are merged at the first node ND_1 while the main pull-down signal MDN and the sub pull-down signal SDN are merged at the second node ND_2. In the second strobe generation circuit 900, the main pull-up signal MUP' and the sub pull-up signal SUP' are merged at the third node ND_3 while the main pull-down signal MDN' and the sub pull-down signal SDN' are merged at the fourth node ND_4. Accordingly, the first strobe generation circuit 800 may have substantially the same logic configuration as the second strobe generation circuit 900, that is, the first strobe generation circuit 800 may have a logic configuration symmetrical to the second strobe generation circuit 900. Embodiments of the invention may remove or minimize a mismatch between the data strobe signal DQS and the data strobe bar signal DQSB to thereby improve an operation reliability while capable of performing a high-speed operation.

Figure 9:
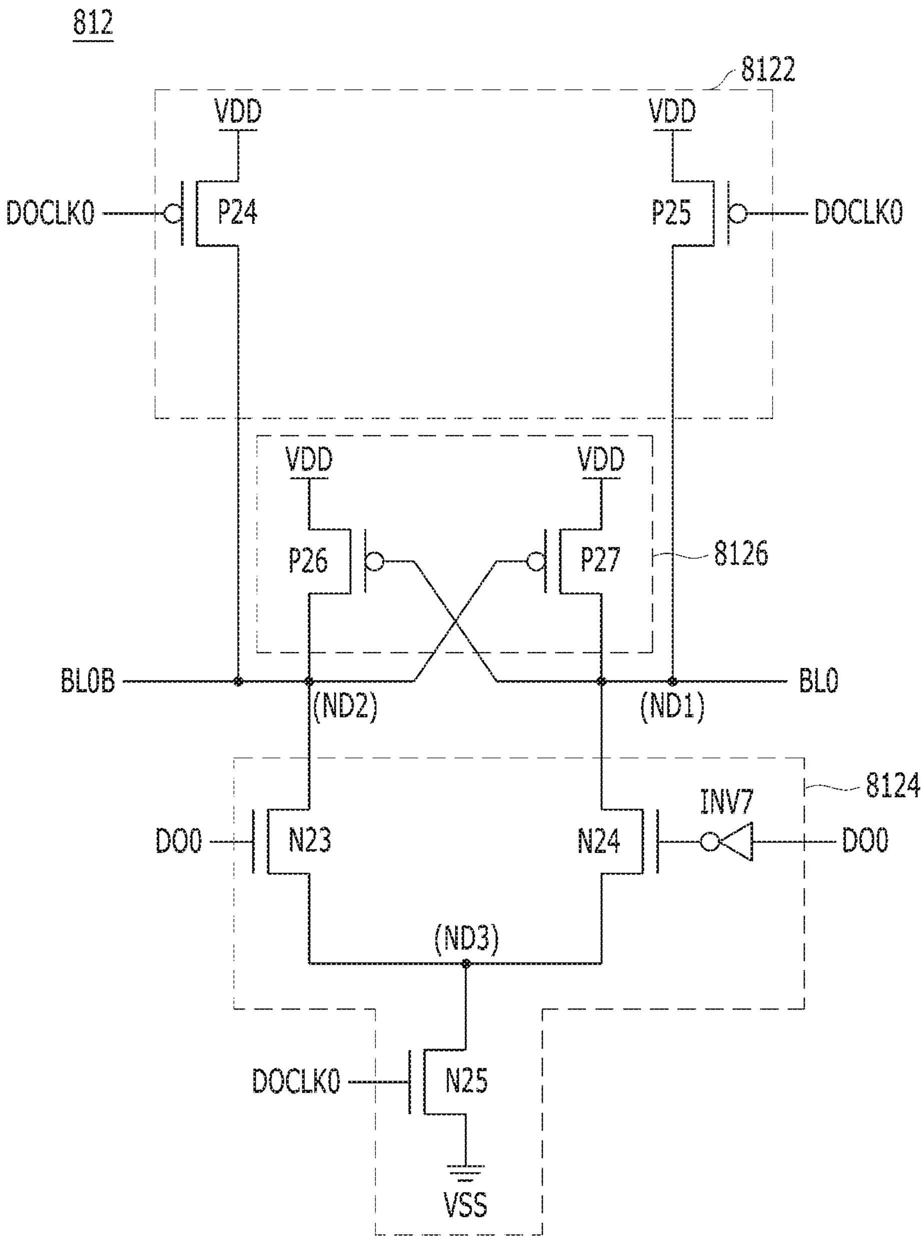
FIG. 9 is a circuit diagram of a first trigger unit illustrated in FIG. 8A.

FIG. 9 is a circuit diagram of the first trigger unit 812 illustrated in FIG. 8A. Since the second to sixteenth trigger units 814 to 818, 822 to 828, 912 to 918, and 922 to 928 in FIGS. 8A and 8B may have substantially the same structure, the first trigger unit 812 will be described as a representative example.

Referring to FIG. 9, the first trigger unit 812 may include an initializer 8122, a charge discharger 8124, and a charge supplier 8126.

The initializer 8122 may include first and second PMOS transistors P24 and P25. The first PMOS transistors P24 and P25 may respectively initialize a first node ND1 that outputs the first main data BL0 and a second node ND2 that outputs the first complementary main data BL0B to a logic high level in a period where the first main clock DOCLK0 is at a logic low level.

The charge discharger 8124 may include first to third NMOS transistors N23 to N25. The first NMOS transistor N23 may be coupled between the second node ND2 and a third node ND3 to be turned on in response to the first input data DO0. The second NMOS transistor N24 may be coupled between the first node ND1 and the third node ND3 to be turned on in response to an output of an inverter INV7 which inverts the first input data DO0 and outputs the inverted first input data. The third NMOS transistor N25 may be turned on in response to the first main clock DOCLK0 to discharge the charge of the third node ND3. The charge discharger 8124 may discharge the charges of the first and second nodes ND1 and ND2 based on a logic level of the first input data DOD during an activation section of the first main clock DOCLK0. The charge discharger 8124 may set the logic levels of the first and second nodes ND1 and ND2. For example, when the first input data DO0 of a logic high level is inputted, since more charges are discharged from the second node ND2 than from the first node ND1, the charge discharger 8124 may set the second node ND2 to a logic low level and set the first node ND1 to a logic high level.

The charge supplier 8126 may include third and fourth PMOS transistors P26 and P27 that are selectively turned on based on the logic levels of the first and second nodes ND1 and ND2 to selectively determine or control the first and second nodes ND1 and ND2. When the first input data DO0 of a logic high level is inputted and the second node ND2 is at a logic low level and the first node ND1 is set to a logic high level, the fourth PMOS transistor P27 may be turned on and may supply electric charges to the first node ND1 so that the charge supplier 8126 may amplify the voltage of the first node ND1. When the first input data DO0 of a logic low level is inputted and the second node ND2 is at a logic high level and the first node ND1 is set to a logic low level, the third PMOS transistor P26 may be turned on and may supply electric charges to the second node ND2 so that the charge supplier 8126 may amplify the voltage of the second node ND2.

With the above-described structure, the first trigger unit 812 may differentially amplify the first input data DO0 during the activation section of the first main clock DOCLK0 to output the first main data BL0 and the first complementary main data BL0B. The first trigger unit 812 may pre-charge the first main data BL0 and the first complementary main data BL0B to a logic high level during an inactivation section of the first main clock DOCLK0.

Figure 10:
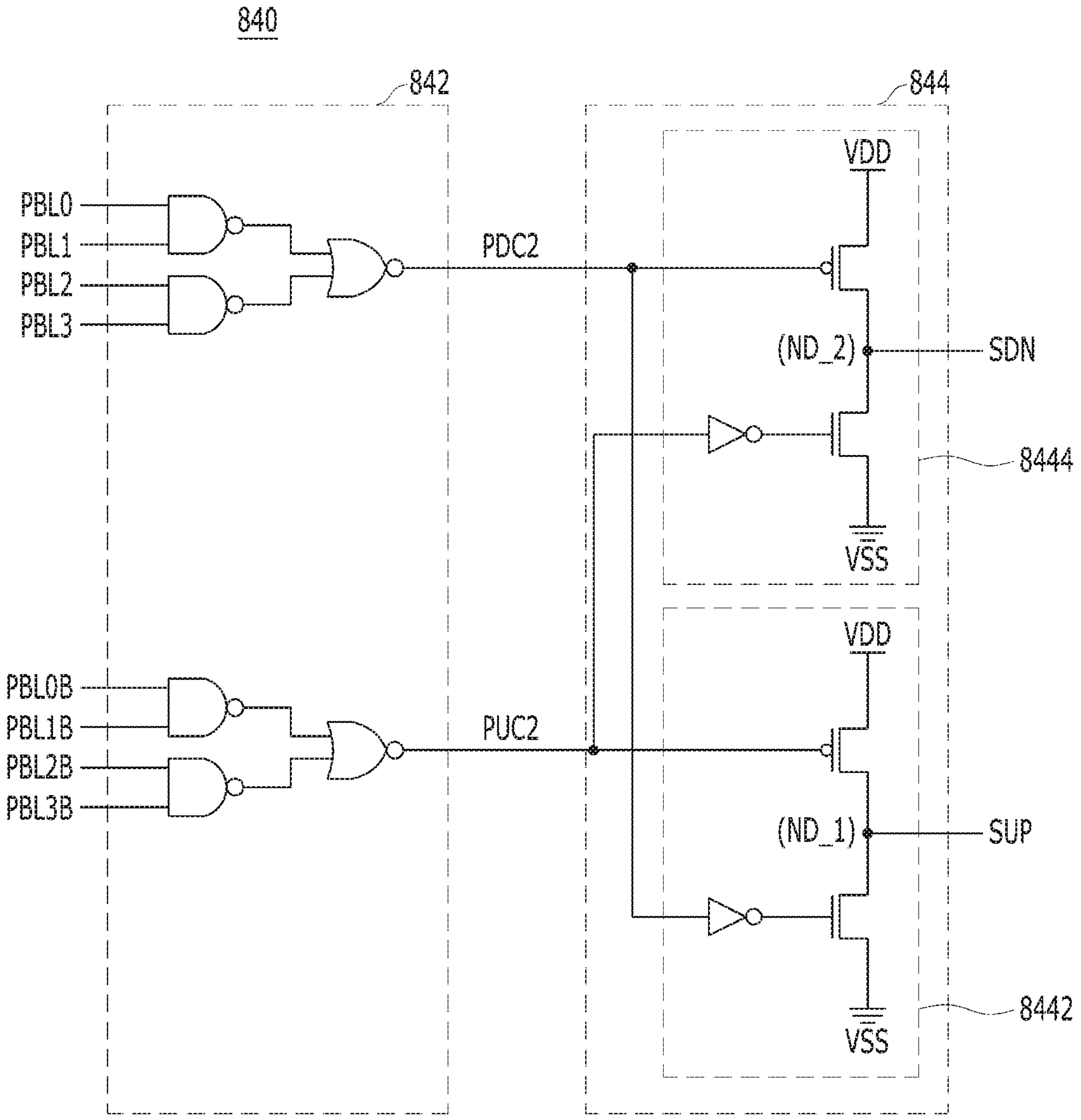
FIG. 10 is a circuit diagram of a first sub hybrid multiplexing circuit illustrated in FIG. 8A.

FIG. 10 is a circuit diagram of the first sub hybrid mux circuit 840 illustrated in FIG. 8A. Since the first and second main hybrid mux circuits 830 and 930, and the second sub hybrid mux circuit 940 in FIGS. 8A and 8B may have substantially the same structure, the first sub hybrid mux circuit 840 will be described as a representative example.

Referring to FIG. 10, the first sub hybrid mux circuit 840 may include a static logic unit 842 and a dynamic logic unit 844.

The static logic unit 842 may generate the second pull-down control signal PDC2 by removing the input loading of the first to fourth sub data PBL0 to PBL3. The static logic unit 842 may generate the second pull-up control signal PUC2 by removing the input loading of the first to fourth complementary sub data PBL0B to PBL3B. In an embodiment of the invention, the static logic unit 842 may output the second pull-down control signal PDC2 at a logic high level when the first to fourth sub data PBL0 to PBL3 are all at a logic high level while outputting the second pull-up control signal PUC2 at a logic high level when the first to fourth complementary sub data PBL0B to PBL3B are all at a logic high level. In other words, the static logic unit 842 may output the second pull-down control signal PDC2 at a logic low level when any one among the first to fourth sub data PBL0 to PBL3 is at a logic low level. Also, the static logic unit 842 may output the second pull-up control signal PUC2 at a logic low level when any one among the first to fourth complementary sub data PBL0B to PBL3B is at a logic low level.

The static logic unit 842 of the first sub hybrid mux circuit 840 may have substantially the same structure as the static logic unit 130 shown in FIG. 5.

The dynamic logic unit 844 may output the sub pull-down signal SDN and the sub pull-up signal SUP, which are selectively driven according to the second pull-down control signal PDC2 and the second pull-up control signal PUC2, to the second node ND_2 and the first node ND_1, respectively. The dynamic logic unit 844 may drive the sub pull-down signal SDN of a logic low level and the sub pull-up signal SUP to have a logic high level when the second pull-down control signal PDC2 is at a logic high level and the second pull-up control signal PUC2 is at a logic low level. Conversely, the dynamic logic unit 844 may drive the sub pull-down signal SDN of a logic high level and the sub pull-up signal SUP of a logic low level when the second pull-down control signal PDC2 is at a logic low level and the second pull-up control signal PUC2 is at a logic high level. The dynamic logic unit 140 may control the sub pull-down signal SDN and the sub pull-up signal SUP to be in a floating state when both the second pull-down control signal PDC2 and the second pull-up control signal PUC2 have a logic high level.

The dynamic logic unit 844 of the first sub hybrid mux circuit 840 may have substantially the same structure as the dynamic logic unit 140 shown in FIG. 5, except for the first latch 144 and the second latch 148. That is, the dynamic logic unit 844 may include a first drive controller 8442 and a second drive controller 8444. The first drive controller 8442 and the second drive controller 8444 may have substantially the same structures as the first drive controller 142 and the second drive controller 146 shown in FIG. 5.

Figure 11:
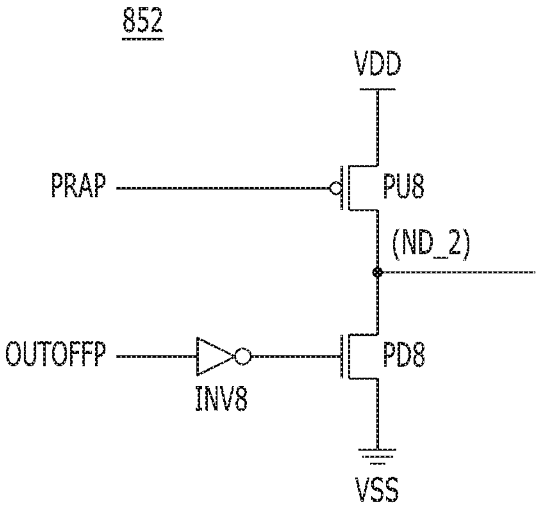
FIG. 11 is a circuit diagram of a first section controller illustrated in FIG. 8A.

FIG. 11 is a circuit diagram of the first section controller 852 illustrated in FIG. 8A. Since the third section control unit 952 of FIG. 8B may have substantially the same structure, the first section controller 852 will be described as a representative example.

Referring to FIG. 11, the first section controller 852 may include a pull-up transistor PU8 and a pull-down transistor PD8. The pull-up transistor PU8 may be coupled between a power source voltage (VDD) terminal and the second node ND_2, and receive the first section control signal PRAP through a gate. The pull-down transistor PD8 may be coupled between a ground voltage (VSS) terminal and the second node ND_2 and receive an output of an inverter INV8 which inverts the second section control signal OUTOFFP. Preferably, the pull-up transistor PU8 may be formed of a PMOS transistor, and the pull-down transistor PD8 may be formed of an NMOS transistor.

As described above, the first section controller 852 may drive the second node ND_2 to a logic high level when the first section control signal PRAP becomes a logic low level, and drive the second node ND_2 to a logic low level when the second section control signal OUTOFFP becomes a logic low level.

Figure 12:
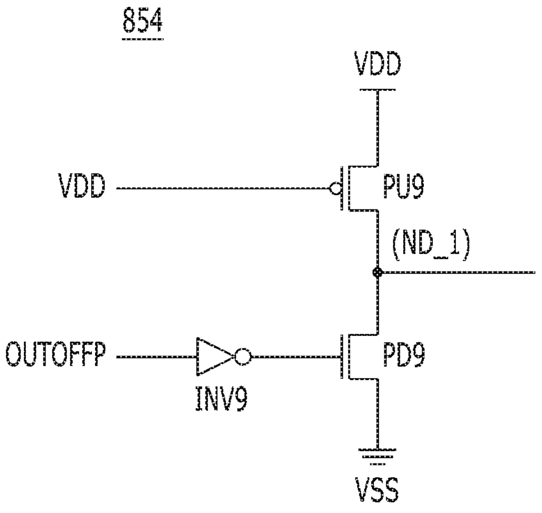
FIG. 12 is a circuit diagram of a second section controller illustrated in FIG. 8A.

FIG. 12 is a circuit diagram of the second section controller 854 illustrated in FIG. 8A. Since the fourth section control unit 954 of FIG. 8B may have substantially the same structure, the second section controller 854 will be described as a representative example.

Referring to FIG. 12, the second section controller 854 may include a pull-up transistor PU9 and a pull-down transistor PD9. The pull-up transistor PU9 may be coupled between a power source voltage (VDD) terminal and the first node ND_1, and receive a power source voltage VDD through a gate. The pull-down transistor PD9 may be coupled between a ground voltage (VSS) terminal and the first node ND_1 and receive an output of an inverter INV9 which inverts the second section control signal OUTOFFP. Preferably, the pull-up transistor PU9 may be formed of a PMOS transistor, and the pull-down transistor PD9 may be formed of an NMOS transistor. The pull-up transistor PU9 maintains a turned-off state since the pull-up transistor PU9 receives the power source voltage VDD through its gate.

As described above, the second section controller 854 may drive the first node ND_1 to a logic low level when the second section control signal OUTOFFP becomes a logic low level.

Referring to FIGS. 8A to 13, an operation for generating a data strobe signal will be explained in detail.

Figure 13:
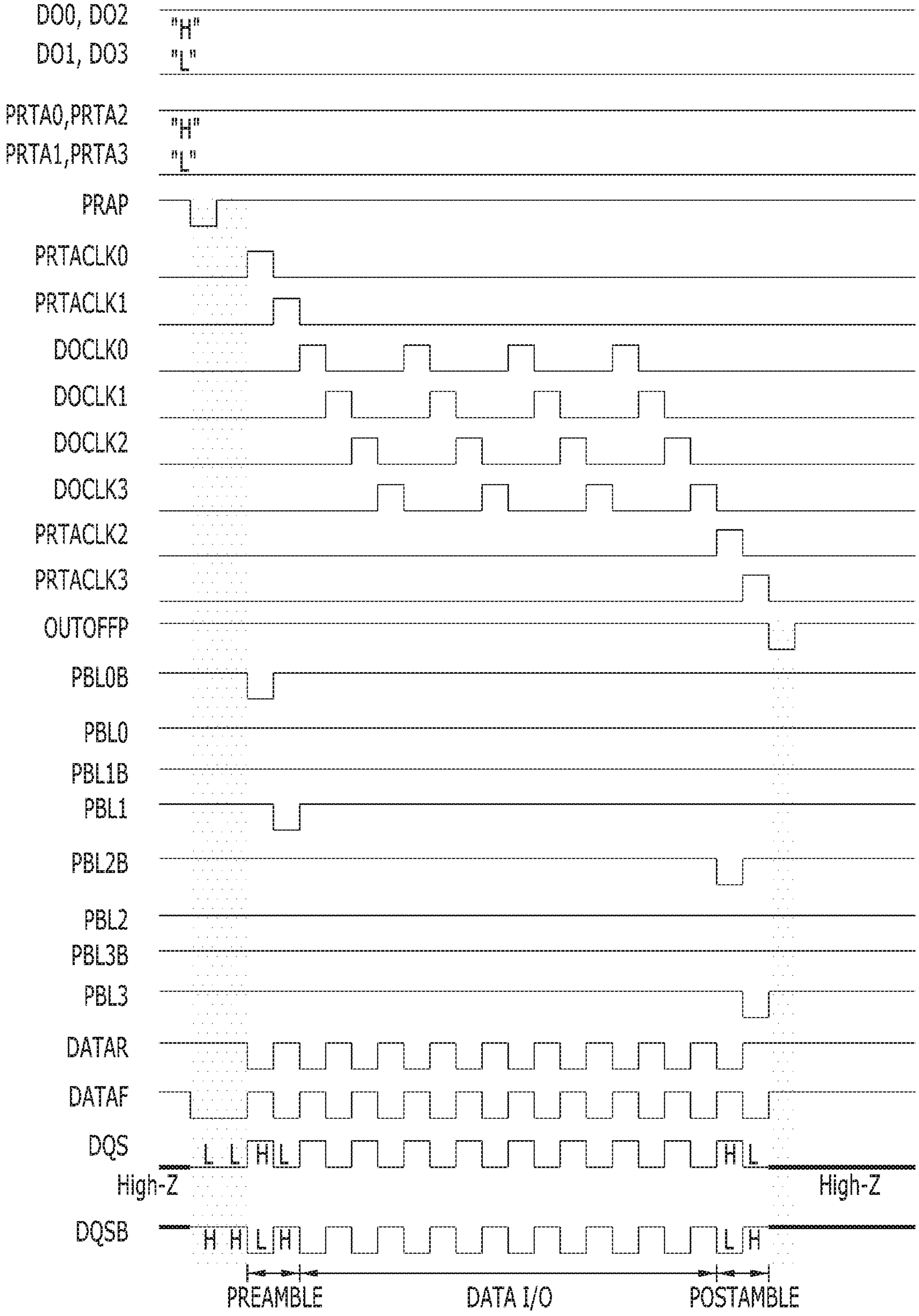
FIG. 13 is a waveform diagram illustrating a strobe signal generation operation in accordance with an embodiment of the invention.

FIG. 13 is a waveform diagram illustrating a strobe signal generation operation in accordance with an embodiment of the invention. FIG. 13 mainly shows an operation of the first strobe generation circuit 800 of FIG. 8A.

Referring to FIG. 13, the first and third input data DO0 and DO2, and the first and third preliminary data PRTA0 and PRTA2 are inputted with a logic high level. The second and fourth input data DO1 and DO3, and the second and fourth preliminary data PRTA1 and PRTA3 are inputted with a logic low level. The data strobe signal DQS toggles in order to receive 16 data.

First, the first section control signal PRAP indicating the entry to the preamble period, transits to a logic low level for a set time. The first section controller 852 drives the second node ND_2 to a logic high level according to the first section control signal PRAP. The second latch 864 inverts and latches a signal at the second node ND_2 and outputs the second latch signal DATAF of a logic low level. Accordingly, the first output driver 870 outputs the data strobe signal DQS of a logic low level by driving the first output terminal NO_1 with the ground voltage VSS.

During the preamble period, the first and second sub clocks PRTACLK0 and PRTACLK1 of the first group start toggling with a phase difference of 90 degrees (°).

The fifth trigger unit 822 differentially amplifies the first preliminary data PRTA0 during an activation section of the first sub clock PRTACLK0 to output the first sub data PBL0 of a logic high level and the first complementary sub data PBL0B of a logic low level. The static logic unit 842 of the first sub hybrid mux circuit 840 outputs the second pull-up control signal PUC2 of a logic low level to the first node ND_1. The dynamic logic unit 844 outputs the sub pull-up signal SUP of a logic high level to the first node ND_1. Accordingly, the first output driver 870 outputs the data strobe signal DQS of a logic high level by driving the first output terminal NO_1 with the power source voltage VDD. Likewise, the sixth trigger unit 824 differentially amplifies the second preliminary data PRTA1 during an activation section of the second sub clock PRTACLK1 to output the second sub data PBL1 of a logic low level and the second complementary sub data PBL1B of a logic high level. The first sub hybrid mux circuit 840 outputs the sub pull-down signal SDN of a logic high level to the second node ND_2. Accordingly, the first output driver 870 outputs the data strobe signal DQS of a logic low level by driving the first output terminal NO_1 with the ground voltage VSS.

During the data I/O period, the first main trigger circuit 810 differentially amplifies the first to fourth input data DO0 to DO3 according to the first to fourth main clocks DOCLK0 to DOCLK3, which are sequentially toggling, and outputs the first to fourth main data BL0 to BL3 and the first to fourth complementary main data BL0B to BL3B. The first main hybrid mux circuit 830 drives the first node ND_1 and the second node ND_2 according to the first to fourth main data BL0 to BL3 and the first to fourth complementary main data BL0B to BL3B. The first latch 862 inverts and latches the signal at the first node ND_1 to output the first latch signal DATAR. The second latch 864 inverts and latches the signal at the second node ND_2 to output the second latch signal DATAF. The first output driver 870 outputs the data strobe signal DQS by driving the first output terminal NO_1 according to the first latch signal DATAR and the second latch signal DATAF.

During the postamble period, the third and fourth sub clocks PRTACLK2 and PRTACLK3 of the second group start toggling with a phase difference of 90 degrees (°).

The seventh trigger unit 826 differentially amplifies the third preliminary data PRTA2 during an activation section of the third sub clock PRTACLK2 to output the third sub data PBL2 of a logic high level and the third complementary sub data PBL2B of a logic low level. The first sub hybrid mux circuit 840 outputs the sub pull-up signal SUP of a logic high level to the first node ND_1. Accordingly, the first output driver 870 outputs the data strobe signal DQS of a logic high level by driving the first output terminal NO_1 with the power source voltage VDD. Likewise, the eighth trigger unit 828 differentially amplifies the fourth preliminary data PRTA3 during an activation section of the fourth sub clock PRTACLK3 to output the fourth sub data PBL3 of a logic low level and the fourth complementary sub data PBL3B of a logic high level. The first sub hybrid mux circuit 840 outputs the sub pull-down signal SDN of a logic high level to the second node ND_2. Accordingly, the first output driver 870 outputs the data strobe signal DQS of a logic low level by driving the first output terminal NO_1 with the ground voltage VSS.

Subsequently, the second section control signal OUTOFFP indicating the exit from the postamble period, transits to a logic low level for a set time. The first section controller 852 drives the second node ND_2 to a logic low level, and the second section controller 854 drives the first node ND_1 to a logic low level, according to the second section control signal OUTOFFP. Thus, both of the first latch signal DATAR and the second latch signal DATAF are outputted to have a logic high level, and the first output driver 870 drives the first output terminal NO_1 in a floating state to maintain the data strobe signal DQS in a high impedance (High-Z) state.

The second strobe generation circuit 900 may output the data strobe bar signal DQSB to have an opposite phase difference, i.e., 180 degrees (°), to the data strobe signal DQS.

According to embodiments of the invention, a strobe generation circuit may be implemented with a hybrid-type mux circuit to generate a data strobe signal DQS and a data strobe bar signal DQSB using substantially the same logic configuration. Accordingly, embodiments of the invention may remove or minimize a mismatch between the data strobe signal DQS and the data strobe bar signal DQSB to thereby improve operation reliability while maintaining the capability of performing a high-speed operation.

While the invention has been illustrated and described with respect to the specific embodiments, it will be apparent to those skilled in the art in light of the present disclosure that various changes and modifications may be made without departing from the spirit and scope of the invention as defined in the following claims.

For example, different types and arrangements of circuit components, e.g., logic gates and transistors, may be used according to the polarity of an inputted signal.

What is claimed is:

1. A strobe generation circuit, comprising:

a main hybrid multiplexing circuit suitable for outputting a main pull-up signal and a main pull-down signal to a first node and a second node, respectively, the main pull-up signal and the main pull-down signal being selectively controlled based on a first pull-up control signal and a first pull-down control signal, which are generated by removing an input loading of a plurality of main data inputted to the main hybrid multiplexing circuit;

a sub hybrid multiplexing circuit suitable for outputting a sub pull-up signal and a sub pull-down signal to the first node and the second node, respectively, the sub pull-up signal and the sub pull-down signal being selectively controlled based on a second pull-up control signal and a second pull-down control signal, which are generated by removing an input loading of a plurality of sub data inputted to the sub hybrid multiplexing circuit;

a latch circuit suitable for latching a signal of the first node and a signal of the second node to output a first latch signal and a second latch signal; and an output driver suitable for outputting a strobe signal according to the first latch signal and the second latch signal.

2. The strobe generation circuit of claim 1, further comprising:

a main trigger circuit suitable for latching input data based on a plurality of main clocks to output the plurality of main data; and a sub trigger circuit suitable for latching preliminary data based on a plurality of sub clocks to output the plurality of sub data.

3. The strobe generation circuit of claim 2, wherein the plurality of main clocks toggle with a set phase difference during a data input/output period, and wherein the plurality of sub clocks include a first group which toggles with the set phase during a preamble period before the data input/output period, and a second group which toggles with the set phase during a post-amble period after the data input/output period.

4. The strobe generation circuit of claim 2, wherein the main trigger circuit differentially amplifies the input data during an activation section of the main clocks to output a plurality of main data and a plurality of complementary main data.

5. The strobe generation circuit of claim 4, wherein the main trigger circuit includes:

a plurality of trigger units corresponding to the main clocks, each of the plurality of trigger units being suitable for differentially amplifying the input data to output the main data and the complementary main data when a corresponding main clock is a first logic level, and pre-charging the main data and the complementary main data to a certain level when the corresponding main dock is a second logic level.

6. The strobe generation circuit of claim 4, wherein the main hybrid multiplexing circuit includes:

a first static logic unit suitable for generating the first pull-down control signal by removing an input loading of the main data, and generating the first pull-up control signal by removing an input loading of the complementary main data; and a first dynamic logic unit suitable for selectively driving the main pull-up signal and the main pull-down signal based on the first pull-down control signal and the first pull-up control signal, and outputting the main pull-up signal and the main pull-down signal to the first node and the second node, respectively.

7. The strobe generation circuit of claim 2, wherein the sub trigger circuit differentially amplifies the preliminary data during an activation section of the sub clocks to output a plurality of sub data and a plurality of complementary sub data.

8. The strobe generation circuit of claim 7, wherein the sub trigger circuit includes:

a plurality of trigger units corresponding to the sub clocks, each of the plurality of trigger units suitable for differentially amplifying the preliminary data to output the sub data and the complementary sub data when a corresponding sub clock is a first logic level, and pre-charging the sub data and the complementary sub data to a certain level when the corresponding sub clock is a second logic level.

9. The strobe generation circuit of claim 7, wherein the sub hybrid multiplexing circuit includes:

a second static logic unit suitable for generating the second pull-down control signal by removing an input loading of the sub data, and generating the second pull-up control signal by removing an input loading of the complementary sub data; and a second dynamic logic unit suitable for selectively driving the sub pull-up signal and the sub pull-down signal based on the second pull-down control signal and the second pull-up control signal, and outputting the sub pull-up signal and the sub pull-down signal to the first node and the second node, respectively.

10. The strobe generation circuit of claim 1, further comprising:

a section control circuit suitable for controlling an entry to a preamble period of the strobe signal according to a first section control signal, and controlling an exit from a postamble period of the strobe signal according to a second section control signal.

11. The strobe generation circuit of claim 10, wherein the section control circuit includes:

a first section controller suitable for driving the second node to a first logic level according to the first section control signal, and driving the second node to a second logic level according to the second section control signal; and a second section controller suitable for driving the first node to the second logic level according to the second section control signal.

12. A semiconductor device, comprising:

a first strobe generation circuit suitable for latching input data and preliminary data based on a plurality of main clocks and a plurality of sub clocks to output a plurality of first main data and a plurality of first sub data, generating first and second control signals by removing an input loading of the first main data and the first sub data, and generating a first strobe signal according to the first and second control signals; and a second strobe generation circuit suitable for latching inverted input data and inverted preliminary data based on the main clocks and the sub clocks to output a plurality of second main data and a plurality of second sub data, generating third and fourth control signals by removing an input loading of the second main data and the second sub data, and generating a second strobe signal according to the third and fourth control signals, wherein the first strobe generation circuit has substantially the same logic configuration as the second strobe generation circuit.

13. The semiconductor device of claim 12, wherein the plurality of main clocks toggle with a set phase difference during a data input/output period, wherein the plurality of sub clocks include a first group which toggles with the set phase during a preamble period before the data input/output period, and a second group which toggles with the set phase during a post-amble period after the data input/output period.

14. The semiconductor device of claim 12, wherein the first strobe generation circuit includes:

a first main trigger circuit suitable for latching the input data based on the main clocks to output the plurality of first main data;

a first sub trigger circuit suitable for latching the preliminary data based on the sub clocks to output the plurality of first sub data;

a first main hybrid multiplexing circuit suitable for outputting a first driving signal which is selectively controlled based on the first control signal generated by removing the input loading of the first main data;

a first sub hybrid multiplexing circuit suitable for outputting a second driving signal which is selectively controlled based on the second control signal generated by removing the input loading of the first sub data; and a first output driver suitable for outputting the first strobe signal according to the first driving signal and the second driving signal.

15. The semiconductor device of claim 12, wherein the second strobe generation circuit includes:

a second main trigger circuit suitable for latching the inverted input data based on the main clocks to output the plurality of second main data;

a second sub trigger circuit suitable for latching the inverted preliminary data based on the sub clocks to output the plurality of second sub data;

a second main hybrid multiplexing circuit suitable for outputting a third driving signal which is selectively controlled based on the third control signal generated by removing the input loading of the second main data;

a second sub hybrid multiplexing circuit suitable for outputting a fourth driving signal which is selectively controlled based on the fourth control signal generated by removing the input loading of the second sub data; and a second output driver suitable for outputting the second strobe signal according to the third driving signal and the fourth driving signal.

16. A strobe generation circuit comprising:

a main hybrid multiplexing circuit suitable for receiving a plurality of main data, generating a first pull-up control signal and a first pull-down control signal based on levels of the plurality of main data, and outputting the main pull-up signal and the main pull-down signal to a first node and a second node, respectively, by driving the first node according to the first pull-up control signal and driving the second node according to the first pull-down control signal;

a sub hybrid multiplexing circuit suitable for receiving a plurality of sub data, generating a second pull-up control signal and a second pull-down control signal based on levels of the plurality of sub data, and outputting the sub pull-up signal and the sub pull-down signal to the first node and the second node, respectively, by driving the first node according to the second pull-up control signal and driving the second node according to the second pull-down control signal;

a latch circuit suitable for latching a signal of the first node and a signal of the second node to output a first latch signal and a second latch signal;

a section control circuit suitable for driving the first node and the second node as set levels, based on an entry of a preamble period and an exit from a postamble period; and an output driver suitable for outputting, to an output node, a strobe signal according to the first latch signal and the second latch signal.

* * * * *